(12) United States Patent
Ikenaga et al.

(10) Patent No.: US 9,040,811 B2
(45) Date of Patent: May 26, 2015

(54) SOLAR-CELL SEALANT AND SOLAR-CELL MODULE USING SAME

(75) Inventors: Shigenobu Ikenaga, Chiba (JP); Fumito Takeuchi, Chiba (JP); Keiji Watanabe, Ichihara (JP); Tomoaki Ito, Ichihara (JP)

(73) Assignee: Mitsui Chemicals Tohcello, Inc., Tokyo (JP)

( * ) Notice: Subject to any disclaimer, the term of this patent is extended or adjusted under 35 U.S.C. 154(b) by 45 days.

(21) Appl. No.: 13/885,863

(22) PCT Filed: Nov. 17, 2011

(86) PCT No.: PCT/JP2011/006412
§ 371 (c)(1),
(2), (4) Date: May 16, 2013

(87) PCT Pub. No.: WO2012/066783
PCT Pub. Date: May 24, 2012

(65) Prior Publication Data
US 2013/0233376 A1 Sep. 12, 2013

(30) Foreign Application Priority Data

Nov. 17, 2010 (JP) .................................. 2010-256916
Dec. 20, 2010 (JP) .................................. 2010-283285

(51) Int. Cl.
*H01L 31/0203* (2014.01)
*H01L 31/048* (2014.01)
(Continued)

(52) U.S. Cl.
CPC .......... *H01L 31/0481* (2013.01); *C08F 210/18* (2013.01); *Y02E 10/50* (2013.01);
(Continued)

(58) Field of Classification Search
CPC ........................ H01L 31/0481; H01L 31/0203
See application file for complete search history.

(56) References Cited

U.S. PATENT DOCUMENTS

| 2009/0165847 A1 | 7/2009 | Mori et al. |
| 2011/0168262 A1 | 7/2011 | Sakojiri |
| 2012/0220728 A1* | 8/2012 | Uekusa et al. ............... 525/240 |

FOREIGN PATENT DOCUMENTS

| JP | 2006-210906 A | 8/2006 |
| JP | 2006-272190 A | 10/2006 |

(Continued)

OTHER PUBLICATIONS

International Search Report (PCT/ISA/210) issued on Feb. 21, 2012, by the Japanese Patent Office as the International Searching Authority for International Application No. PCT/JP2011/006412.
Shouji Iwatsuki et al., "Alternating Copolymerization Behavior of 2,3,5,6-Tetrafluoro-7,7,8,8-tetracyanoquinodimethan as a Very Powerful Acceptor Monomer", Macromolecules, vol. 15, No. 2, Mar.-Apr. 1982, pp. 347-353.

(Continued)

*Primary Examiner* — Ling Choi
*Assistant Examiner* — Catherine S Branch
(74) *Attorney, Agent, or Firm* — Brundidge & Stanger, P.C.

(57) ABSTRACT

A solar-cell sealant that has excellent properties such as transparency, flexibility, adhesiveness, heat resistance, appearance, cross-linking characteristics, electrical characteristics, and calenderability. A solar-cell sealant that contains an ethylene/α-olefin/unconjugated-polyene copolymer satisfying requirements (a1) through (a3). Requirement (a1) is that constituent units derived from ethylene constitute 80-90 mol %, constituent units derived from C3-20 α-olefin constitute 9.99-19.99 mol %, and constituent units derived from an unconjugated polyene constitute 0.01-5.0 mol % of said copolymer. Requirement (a2) is that the MFR of said copolymer, as measured in accordance with ASTM D1238 at 190° C. under a 2.16 kg load, be at least 2 g/10 min. and less than 10 g/10 min. Requirement (a3) is that the Shore A hardness of said copolymer, as measured in accordance with ASTM D2240, be 60 to 85.

15 Claims, 3 Drawing Sheets

(51) Int. Cl.
*C08F 210/18* (2006.01)
*C09K 3/10* (2006.01)
*C08F 4/659* (2006.01)

(52) U.S. Cl.
CPC ............ *H01L 31/0203* (2013.01); *C09K 3/10* (2013.01); *C09K 2200/0642* (2013.01); *C08F 4/65908* (2013.01); *C08F 4/65912* (2013.01)

(56) References Cited

FOREIGN PATENT DOCUMENTS

| | | |
|---|---|---|
| JP | 2009-301781 A | 12/2009 |
| JP | 2010-0053298 A | 3/2010 |
| JP | 2010-254989 A | 11/2010 |
| JP | 2010-275488 A | 12/2010 |
| WO | WO 2007/061030 A1 | 5/2007 |

OTHER PUBLICATIONS

G. Joseph Ray et al., "Carbon-13 Nuclear Magnetic Resonance Determination of Monomer Composition and Sequence Distributions in Ethylene-Propylene Copolymers Prepared with a Stereoregular Catalyst System", Macromolecules, vol. 10, No. 4, Jul.-Aug. 1977, pp. 773-778.

Bruce A. Harrington et al., "Ethylene Elastomers: A Comparison of Conventional Ziegler-Natta and Metallocene Products", American Chemical Society Rubber Division Technical Meeting, Paper No. 4, Oct. 14-17, 2003, 13 pages.

Masayuki Yamaguchi, "Basic Properties of Molten Bodies", Seikei-Kakou, vol. 20, No. 7, May 7, 2008, pp. 400-404.

Florian J. Stadler, et al., Influence of Short-Chain Branching of Polyethylenes on the Temperature Dependence of Rheological Properties in Shear, Macromolecular Chemistry and Physics, vol. 208, 2007, pp. 2449-2454.

* cited by examiner

SOLAR-CELL SEALANT AND SOLAR-CELL MODULE USING SAME

TECHNICAL FIELD

The present invention relates to solar cell encapsulants that exhibit superior transparency, flexibility, adhesion, heat resistance, appearance, crosslinking characteristics, electrical characteristics, and calenderability. The present invention also relates to solar cell modules manufactured using the solar cell encapsulants.

BACKGROUND ART

With growing concerns about global environmental issues and energy issues, solar batteries have been attracting attention as a clean, sustainable means of energy generation. When solar batteries are used in outdoor environment such as on the roof of a building, they are used to form a module.

A solar cell module is generally manufactured through the following procedure: First, crystalline solar cells containing for example poly- or mono-crystalline silicon (hereinafter referred to as "photovoltaic devices" or "cells" in some cases), or thin-film solar cells containing a thin film (several micrometers in thickness) of amorphous or crystalline silicon deposited on a glass or other substrate are provided. Next, in the case of a crystalline solar cell module, a module assembly is constructed in which a solar cell module protection sheet (front protection sheet), a solar cell encapsulant, the crystalline solar cells, a solar cell encapsulant, and a solar cell module protection sheet (rear protection sheet) are sequentially layered on top of each other. On the other hand, in the case of a thin-film solar cell module, a module assembly is constructed in which the thin-film solar cells, a solar cell encapsulant, and a solar cell module protection sheet (back protection sheet) are sequentially layered on top of each other. A solar cell module is then manufactured for example by a vacuum lamination process in which the module layers are laminated together under heat and pressure. Solar cell modules manufactured in this manner exhibit weather resistance, lending themselves to be suitably used in outdoor environment such as on the roof of a building.

For its superior flexibility, adhesion and other properties, ethylene-vinyl acetate (EVA) copolymer has been widely used as the material of solar cell encapsulants. For example, Patent Literature 1 discloses an encapsulant film which is formed of an EVA composition containing a crosslinking agent and a trimellitate and which exhibits superior adhesion and film-forming property. However, with regard to the use of EVA compositions as the constituent material of the solar cell encapsulants, there have been concerns about possible negative impacts on the solar cells by acetic acid gas and/or other components generated upon decomposition of EVA.

In an effort to solve the foregoing problem, it has been proposed to employ polyolefin materials as the encapsulant film materials, particularly ethylene materials from the perspective of their superior insulation property.

CITATION LIST

Patent Literature

PTL 1
Japanese Patent Application Laid-Open No. 2010-53298
PTL 2
Japanese Patent Application Laid-Open No. 2006-210906

SUMMARY OF INVENTION

Technical Problem

The studies conducted by the inventors revealed, however, that it was difficult for polyolefin compositions to simultaneously satisfy a variety of characteristics including transparency, anti-blocking property, and calenderability. Moreover, the polyolefin copolymer disclosed by Patent Literature 2 suffers from such drawbacks as insufficient crosslinking characteristics or increase in strain associated with crosslinking, possibly causing deformation of and/or cracking in the glass substrate within the solar cell module.

The present invention has been made in view of the foregoing problems pertinent in the art; an object of the present invention is to identify a guide to confer necessary physical properties to ethylene/α-olefin/non-conjugated polyene copolymers to be contained in solar cell encapsulants, and to provide a solar cell encapsulant that exhibits superior characteristics such as transparency, flexibility, adhesion, heat resistance, appearance, crosslinking characteristics, electrical characteristics, and calenderability. A further object of the present invention is to provide a solar cell module manufactured using the solar cell encapsulant.

Along with the recent widespread of solar power generation, large-scale power generation systems such as mega solar power plants have been increasingly developed. In order, for example, to reduce transmission loss in the large-scale power generation system, high system voltage is used in some cases. An increase in the system voltage results in a large potential difference between the frame and solar cell within the solar cell module. Because the frame of a solar cell module is usually grounded, when the system voltage reaches 600-1,000V, a maximum potential difference between the frame and solar cells within the module reaches as high as 600-1,000V, a level comparable to the system voltage. Further, since glass has lower electrical resistance than the encapsulant, a large potential difference occurs also between the glass and solar cells via the frame.

As described above, solar cell modules generate electricity in daytime while generating a large potential difference between the glass and solar cells within the module. Solar cell modules that generate electricity with such a configuration may undergo significant deterioration in their output characteristics. Some reports indicate that potential induced degradation (PID) occurs in crystalline solar cells that experienced characteristics deterioration. A preferred embodiment of the present invention reduces the occurrence of PID within the module by modifying the encapsulant members that directly contacts the crystalline solar cells.

A further object of the present invention is to provide a solar cell module manufactured using the solar cell encapsulant.

Polyethylene elastomer compositions, particularly polyethylene elastomer compositions containing a non-conjugated polyene as the monomer unit, have the drawback of exhibiting high viscosity when kneaded and therefore low moldability. Namely, there remains a need in the art to provide polyethylene elastomer compositions that exhibit superior calenderability without compromising transparency and/or crosslinking characteristics.

A second embodiment of the present invention has been made in view of the foregoing circumstance, and an object thereof is to provide a polyethylene elastomer composition that exhibits superior calenderability without compromising transparency and/or crosslinking characteristics.

Solution to Problem

The inventors conducted extensive studies in an aim to achieve the foregoing objectives and established that a specific ethylene/α-olefin/non-conjugated polyene copolymer whose proportions of ethyene unit, α-olefin unit and conconjugated polyene unit, MFR, and Shore A hardness satisfy predetermined requirements can provide a solar cell encapsulant that exhibits superior characteristics such as transparency, flexibility, adhesion, heat resistance, appearance, crosslinking characteristics, electrical characteristics, and calenderability. As a consequence, the inventors completed the present invention. Namely, the present invention provides the solar cell encapsulants given below.

[1] A solar cell encapsulant comprising an ethylene/α-olefin/non-conjugated polyene copolymer which satisfies the following requirements a1) to a3):

a1) a structural unit derived from ethylene is present in an amount of 80-90 mol %, a structural unit derived from a $C_{3-20}$ α-olefin is present in an amount of 9.99-19.99 mol %, and a structural unit derived from a non-conjugated polyene is present in an amount of 0.01-5.0 mol %;

a2) a melt flow rate measured in accordance with ASTM D1238 at 190° C. under a load of 2.16 kg is 2 g/10 min to 10 g/10 min; and a3) a Shore A hardness measured in accordance with ASTM D2240 is 60-85.

[2] The solar cell encapsulant according to [1], wherein the solar cell encapsulant satisfies the following requirement a4):

a4) a volume resistivity measured at 100° C. and applied voltage of 500V in accordance with JIS K6911 is $1.0 \times 10^{13}$ - $1.0 \times 10^{18}$ Ω·cm.

[3] The solar cell encapsulant according to [1] or [2], further comprising 0.1-5.0 parts by weight of a silane coupling agent and 0.1-2.5 parts by weight of a crosslinking agent per 100 parts by weight of the ethylene/α-olefin/non-conjugated polyene copolymer.

[4] The solar cell encapsulant according to [3], wherein the crosslinking agent is an organic peroxide having a 1 minute half-life temperature of 100-170° C.

[5] The solar cell encapsulant according to [4], further comprising 0.05-5 parts by weight of at least one agent selected from the group consisting of a UV absorber, a thermal stabilizer, and a hindered amine light stabilizer, per 100 parts by weight of the ethylene/α-olefin/non-conjugated polyene copolymer.

[6] The solar cell encapsulant according to [3], further comprising 0.05-5 parts by weight of a crosslinking aid per 100 parts by weight of the ethylene/α-olefin/non-conjugated polyene copolymer.

[7] The solar cell encapsulant according to any one of [1] to [6], wherein the ethylene/α-olefin/non-conjugated polyene copolymer further satisfies the following requirement a5):

a5) a B value calculated from a $^{13}$C-NMR spectrum and the following formula (1) is 0.9-1.3:

$$B=(c+d)/(2 \times a \times (e+f)) \quad (1)$$

where "a" denotes a ratio of the structural unit derived from ethylene (molar fraction of ethylene) in the ethylene/α-olefin/non-conjugated polyene copolymer;

"c" denotes a ratio of a structural unit of ethylene/α-olefin chain (molar fraction of ethylene/α-olefin dyad sequence);

"d" denotes a ratio of a structural unit of ethylene/non-conjugated polyene chain (molar fraction of ethylene/non-conjugated polyene dyad sequence);

"e" denotes a ratio of the structural unit derived from the α-olefin (molar fraction of α-olefin); and "f" denotes a ratio of the structural unit derived from the non-conjugated polyene (molar fraction of non-conjugated polyene).

[8] The solar cell encapsulant according to any one of [1] to [7], wherein the ethylene/α-olefin/non-conjugated polyene copolymer further satisfies the following requirement a6):

a6) a maximum value Pmax and a minimum value Pmin of an ethylene distribution parameter P measured by GPC-of-fline-FTIR satisfy the following formula (2):

$$P\text{max}/P\text{min} \leq 1.4 \quad (2)$$

[9] The solar cell encapsulant according to any one of [1] to [8], wherein the ethylene/α-olefin/non-conjugated polyene copolymer further satisfies the following requirement a7):

a7) an activation energy (Ea) of fluidization is 28-45 kJ/mol.

[10] The solar cell encapsulant according to any one of [1] to [9], wherein the ethylene/α-olefin/non-conjugated polyene copolymer further satisfies the following requirement a8):

a8) a molecular weight distribution Mw/Mn based on gel permeation chromatography (GPC) is 1.2-3.5.

[11] The solar cell encapsulant according to any one of [1] to [10], wherein the ethylene/α-olefin/non-conjugated polyene copolymer further satisfies the following requirement a9):

a9) a chlorine ion content in an eluate from solid-phase-extraction as detected by ion chromatography is 2 ppm or less.

[12] The solar cell encapsulant according to any one of [1] to [11], wherein the ethylene/α-olefin/non-conjugated polyene copolymer further satisfies the following requirement a10):

a10) an amount of the ethylene/α-olefin/non-conjugated polyene copolymer extracted into methyl acetate is 5.0 wt % or less.

[13] The solar cell encapsulant according to any one of [1] to [12], wherein the solar cell encapsulant is in sheet form.

[14] A solar cell module comprising:
a transparent front protection member;
a back protection member;
a solar cell sandwiched between the front protection member and the back protection member; and
an encapsulant that encapsulates the solar cell between the transparent front protection member and back protection member,
wherein the encapsulant is a cured material of the solar cell encapsulant according to any one of [1] to [13].

[15] The solar cell encapsulant according to any one of [1] to [13], wherein the solar cell encapsulant is prepared by calendering a melt-kneaded material into sheet, the melt-kneaded material comprising the ethylene/α-olefin/non-conjugated polyene copolymer and an additive.

Moreover, in order to increase the moldability of the resultant solar cell encapsulant, the inventors considered to add oils and/or plasticizers to the polyethylene elastomer composition. As a result, the inventors established that addition of oils and/or plasticizer may cause reduction in crosslinking characteristics and/or transparency of a polyethylene elastomer composition containing a conjugated polyene as the monomer unit. A second embodiment of the present invention provides the solar cell encapsulants given below.

[16] A solar cell encapsulant comprising:

(A) an ethylene/α-olefin/diene copolymer containing 50-95 mol % of a structural unit derived from ethylene, the ethylene/α-olefin/diene copolymer having a Mooney viscosity ML(1+4)100° C. of 30-90;

(B) a paraffinic oil containing 55-90 wt % of a paraffin component, less than 5 wt % of an aromatic component, less than 40 wt % of a naphthenic component, and 200 ppm or less of a sulfur component; and (C) a crosslinking agent, wherein an MFR of a resin composition composed of the ethylene/α-olefin/diene copolymer (A) and the paraffinic oil (B), as measured at 190° C. under a load of 2.16 kg, is 2-10 g/10 min.

[17] The solar cell encapsulant according to [16], wherein a melting point of the ethylene/α-olefin/diene copolymer (A), as measured in accordance with JIS-K7121, is 70° C. or below.

[18] The solar cell encapsulant according to [16] or [17], wherein a total light transmittance of a cured material of the solar cell encapsulant is 90% or more.

[19] The solar cell encapsulant according to any one of [16] to [18], further comprising at least one additive selected from the group consisting of a crosslinking aid, a UV absorber, a weathering stabilizer, an antioxidant, and an adhesion promoter.

[20] A process for producing the solar cell encapsulant according to any one of [16] to [18], comprising:

molding a resin composition into sheet form, the resin composition prepared by melt-kneading the ethylene/α-olefin/diene copolymer, the paraffinic oil, and the crosslinking agent.

[21] The process according to [20], wherein the resin composition is molded into sheet form by calendering.

[22] The process according to [21], wherein a calender roll temperature during calendering is 55-110° C.

[23] A solar cell encapsulant produced by the process according to any one of [20] to [22].

[24] A solar cell module comprising:

a transparent front protection member;

a back protection member;

a plurality of solar cells sandwiched between the front protection member and the back protection member; and an encapsulant that encapsulates the solar cells between the transparent front protection member and back protection member, wherein the encapsulant is a cured material of the solar cell encapsulant according to any one of [16] to [19] and [23].

Advantageous Effects of Invention

Since the solar cell encapsulant of the present invention contains a specific ethylene/α-olefin/non-conjugated polyene copolymer, it exhibits superior characteristics such as transparency, flexibility, adhesion, heat resistance, appearance, crosslinking characteristics, electrical characteristics, and calenderability. With such a solar cell encapsulant, it is possible to provide a solar cell module that has a good balance among different characteristics, and even when temperature rise occurs during the operation of the solar cell module, troubles like deformation of encapsulant can be avoided. It is thus possible to provide a solar cell module that has a superior economic efficiency (e.g., reducing costs) without compromising the solar cell appearance.

More advantageously, with the solar cell encapsulant of the present invention, it is possible to provide a solar cell module that can significantly reduce the occurrence of PID even when the module keeps generating electricity while receiving a high voltage between the frame and solar cells.

DESCRIPTION OF EMBODIMENTS

Figure 1:
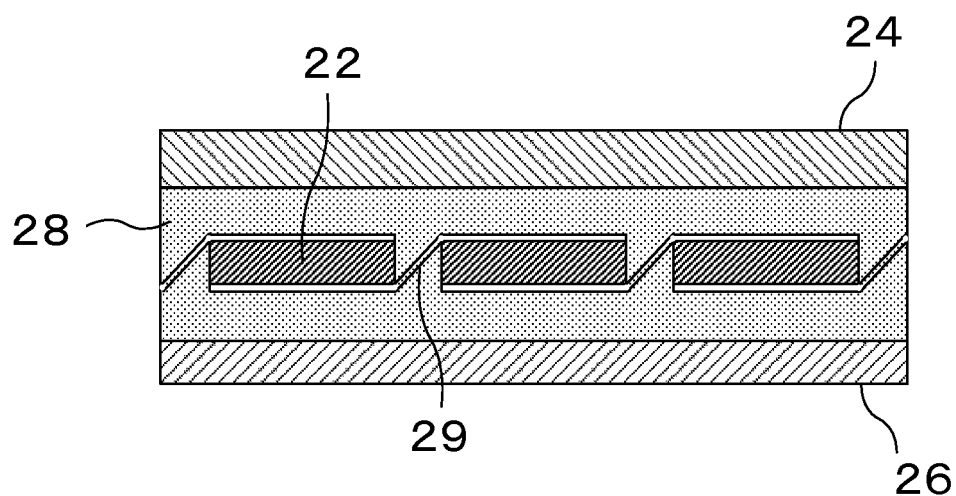
FIG. 1 is a cross-sectional view schematically illustrating an embodiment of a solar cell module of the present invention.

These and other objects, features and advantages of the present invention will become apparent from the following detailed description and the accompanying drawings. Embodiments of the present invention will now be described. Unless otherwise indicated, "-" represents a range of numbers including the lower and upper limits.

1. Solar Cell Encapsulant (1) First Solar Cell Encapsulant

A solar cell encapsulant according to a first embodiment of the present invention contains an ethylene/α-olefin/non-conjugated polyene copolymer.

(Ethylene/α-Olefin/Non-conjugated Polyene Copolymer)

The ethylene/α-olefin/non-conjugated polyene copolymer used for the solar cell encapsulant of the present invention is obtained by copolymerizing ethylene, a $C_{3-20}$ α-olefin, and a non-conjugated polyene. As the α-olefin it is typically possible to employ $C_{3-20}$ α-olefins either alone or in combination. Preferable α-olefins are α-olefins having 10 carbon atoms or less, with $C_{3-8}$ α-olefins being particularly preferable. Examples of the α-olefins include propylene, 1-butene, 1-pentene, 1-hexene, 3-methyl-1-butene, 3,3-dimethyl-1-butene, 4-methyl-1-pentene, 1-octene, 1-decene, and 1-dodecene. Particularly, propylene, 1-butene, 1-pentene, 1-hexene, and 4-methyl-1-pentene are preferable for their high availability in the market.

As the non-conjugated polyene, compounds having two or more non-conjugated unsaturated bonds can be employed without limitation. Specifically, as the non-conjugated polyene, both a non-conjugated cyclic polyene and a non-conjugated chain polyene can be employed. Two or more of non-conjugated cyclic polyenes and non-conjugated chain polyenes can be used in combination. Moreover, the non-conjugated polyene can be a non-conjugated polyene having only one catalytically polymerizable carbon-carbon double bond in one molecule, and be a non-conjugated polyene having two catalytically polymerizable carbon-carbon doubles bond in one molecule. It should be noted that a chain polyene terminated with vinyl group (CH2=CH—) on both ends is not defined as the non-conjugated polyene having only one polymerizable carbon-carbon double bond in one molecule excludes. When two or more carbon-carbon double bonds exist in such a non-conjugated polyene, it is preferable that only one of the carbon-carbon double bond exist in the vinyl group at the molecular terminal, with the other carbon-carbon-double bond(s) (C=C) within the molecular chain (including main and side chains) of the internal olefin structure. The scope of non-conjugated cyclic polyene and non-conjugated chain polyene embraces the above-described non-conjugated polyene having only one catalytically polymerizable carbon-carbon double bond in one molecule, and the above-described non-conjugated polyene having two catalytically polymerizable carbon-carbon doubles bond in one molecule. The non-conjugated chain polyenes include non-conjugated trienes or tetraenes.

Specific examples of the non-conjugated polyenes include compounds disclosed in paragraphs [0061]-[0084] of WO2005/105867 and in paragraphs [0026]-[0035] of JP-A No. 2008-308696.

In particular, the non-conjugated polyenes include 1,4-hexadiene, 1,5-heptadiene, 1,6-octadiene, 1,7-nonadiene, 1,8-decadiene, 1,12-tetradecadiene, 3-methyl-1,4-hexadiene, 4-methyl-1,4-hexadiene, 5-methyl-1,4-hexadiene, 4-ethyl-1,4-hexadiene, 3,3-dimethyl-1,4-hexadiene, 5-methyl-1,4-heptadiene, 5-ethyl-1,4-heptadiene, 5-methyl-1,5-heptadiene, 6-methyl-1,5-heptadiene, 5-ethyl-1,5-heptadiene, 4-methyl-1,4-octadiene, 5-methyl-1,4-octadiene, 4-ethyl-1,4-octadiene, 5-ethyl-1,4-octadiene, 5-methyl-1,5-octadiene, 6-methyl-1,5-octadiene, 5-ethyl-1,5-octadiene, 6-ethyl-1,5-octadiene, 6-methyl-1,6-octadiene, 7-methyl-1,6-octadiene, 6-ethyl-1,6-octadiene, 6-propyl-1,6-octadiene, 6-butyl-1,6-octadiene, 7-methyl-1,6-octadiene, 4-methyl-1,4-nonadiene, 5-methyl-1,4-nonadiene, 4-ethyl-1,4-nonadiene, 5-ethyl-1,4-nonadiene, 5-methyl-1,5-nonadiene, 6-methyl-1,5-nonadiene, 5-ethyl-1,5-nonadiene, 6-ethyl-1,5-nonadiene, 6-methyl-1,6-nonadiene, 7-methyl-1,6-nonadiene, 6-ethyl-1,6-nonadiene, 7-ethyl-1,6-nonadiene, 7-methyl-1,7-nonadiene, 8-methyl-1,7-nonadiene, 7-ethyl-1,7-nonadiene, 5-methyl-1,4-decadiene, 5-ethyl-1,4-decadiene, 5-methyl-1,5-decadiene, 6-methyl-1,5-decadiene, 5-ethyl-1,5-decadiene, 6-ethyl-1,5-decadiene, 6-methyl-1,6-decadiene, 6-ethyl-1,6-decadiene, 7-methyl-1,6-decadiene, 7-ethyl-1,6-decadiene, 7-methyl-1,7-decadiene, 8-methyl-1,7-decadiene, 7-ethyl-1,7-decadiene, 8-ethyl-1,7-decadiene, 8-methyl-1,8-decadiene, 9-methyl-1,8-decadiene, 8-ethyl-1,8-decadiene, 6-methyl-1,6-undecadiene, and 9-methyl-1,8-undecadiene.

Examples of the non-conjugated trienes or tetraenes include 4-ethylidene-8-methyl-1,7-nonadiene, 6,10-dimethyl-1,5,9-undecatriene, 5,9-dimethyl-1,4,8-decatriene, 4,8-dimethyl-1,4,8-decatriene, 6,9-dimethyl-1,5,8-decatriene, 6,8,9-trimethyl-1,5,8-decatriene, 6,10,14-trimethyl-1,5,9,13-pentadecatetraene, 6-ethyl-10-methyl-1,5,9-undecatriene, and 4-ethylidene-8,12-dimethyl-1,7,11-tridecatriene. These non-conjugated chain polyenes can be used singly or in combination. Preferably, 7-methyl-1,6-octadiene, 4,8-dimethyl-1,4,8-decatriene, and the like are employed.

An example of the non-conjugated polyene having only one polymerizable carbon-carbon double bond in one molecule is a polyene composed of an alicyclic moiety having one carbon-carbon double bond (unsaturated bond) and of a chain moiety having an internal olefin bond (carbon-carbon double bond) that undergoes no or less metallocene-catalyzed polymerization, such as alkylidene group. Specific examples thereof include 5-ethylidene-2-norbornene (ENB), 5-propylidene-2-norbornene, and 5-butylidene-2-norbornene. In particular, 5-ethylidene-2-norbornene (ENB) is preferable. Other examples of the non-conjugated polyene having only one polymerizable carbon-carbon double bond in one molecule include 2-methyl-2,5-norbornadiene and 2-ethyl-2,5-norbornadiene. These non-conjugated polyenes having only one polymerizable carbon-carbon double bond in one molecule are used singly or in combination.

Specific examples of the non-conjugated polyene having two polymerizable carbon-carbon doubles bond in one molecule include 5-alkenyl-2-norbornene such as 5-vinyl-2-norbornene (VNB) and 5-allyl-2-norbornene; alicyclic polyenes such as 2,5-norbornadiene, dicyclopentadiene (DCPD), and tetracyclo[4,4,0,12.5,17.10]deca-3,8-diene; and a,w-dienes such as 1,7-octadiene and 1,9-decadiene. In particular, 5-vinyl-2-norbornene (VNB), dicyclopentadiene, 2,5-norbornadiene, 1,7-octadiene, and 1,9-decadiene are preferable, with 5-vinyl-2-norbornene (VNB) and dicyclopentadiene being most preferable.

Specific examples of the ethylene/α-olefin/non-conjugated polyene copolymer include ethylene/propylene/4,8-dimethyl-1,4,8-decatrien (DMDT) copolymer, ethylene/propylene/5-vinyl-2-norbornene (VNB) copolymer, ethylene/propylene/5-ethylidene-2-norbornene (ENB) copolymer, ethylene/propylene/dicyclopentadiene copolymer, ethylene/propylene/4,8-dimethyl-1,4,8-decatriene (DMDT)/5-vinyl-2-norbornene (VNB) quarterpolymer, ethylene/propylene/5-butylidene-2-norbornene/5-vinyl-2-norbornene (VNB) quarterpolymer, ethylene/propylene/5-ethylidene-2-norbornene (ENB)/5-vinyl-2-norbornene (VNB) quarterpolymer, ethylene/1-butene/4,8-dimethyl-1,4,8-decatriene (DMDT) copolymer, ethylene/1-butene/5-vinyl-2-norbornene (VNB) copolymer, ethylene/1-butene/5-ethylidene/2-norbornene (ENB) copolymer, ethylene/1-butene/dicyclopentadiene copolymer, ethylene/1-butene/4,8-dimethyl-1,4,8-decatriene (DMDT)/5-vinyl-2-norbornene (VNB) quarterpolymer, ethylene/1-butene/5-butylidene-2-norbornene/5-vinyl-2-norbornene (VNB) quarterpolymer, and ethylene/1-butene/5-ethylidene-2-norbornene (ENB)/5-vinyl-2-norbornene (VNB) quarterpolymer, ethylene/1-octene/4,8-dimethyl-1,4,8-decatriene (DMDT) copolymer, ethylene/1-octene/5-vinyl-2-norbornene (VNB) copolymer, ethylene/1-octene/5-ethylidene-2-norbornene (ENB) copolymer, ethylene/1-octene/dicyclopentadiene copolymer, ethylene/1-octene/4,8-dimethyl-1,4,8-decatriene (DMDT)/5-vinyl-2-norbornene (VNB) quarterpolymer, ethylene/1-octene/5-butylidene-2-norbornene/5-vinyl-2-norbornene (VNB) quarterpolymer, and ethylene/1-octene/5-ethylidene-2-norbornene (ENB)/5-vinyl-2-norbornene (VNB) quarterpolymer. The ethylene/α-olefin/non-conjugated polyene copolymer may be either a random copolymer or a block copolymer, but is preferably a random copolymer from the viewpoint of flexibility.

The ethylene/α-olefin/non-conjugated polyene copolymer contained in a solar cell encapsulant according to the first embodiment of the present invention satisfies the requirements a1) to a3) described below.

(Requirement a1))

The structural unit derived from a $C_{3-20}$ α-olefin (hereinafter also referred to as "α-olefin unit") contained in the ethylene/α-olefin/non-conjugated polyene copolymer is present in an amount of 9.99-19.99 mol %, preferably 11-19.99-mol %, and more preferably 12.5-19 mol %.

When the α-olefin unit content is less than 9.99 mol %, the copolymer exhibits high crystallinity and therefore tends to show low transparency. Further, when the α-olefin unit content is less than 9.99 mol %, problems occur wherein during the calendering process the molten ethylene/α-olefin/non-conjugated polyene copolymer in the calender nip (hereinafter also referred to as "rolling bank") cannot be easily fed between the calender rolls, and/or wrapping of the melt around the calender rolls worsens. Accordingly, the temperature during the calendering process needs to be set high (e.g., 100° C. or above). When the calendering temperature is set high, organic peroxides compounded in the ethylene/α-olefin/non-conjugated polyene copolymer cause crosslinking reactions to occur, generating unwanted gel-like matter in the encapsulant, and therefore sheet appearance tends to be deteriorated. Calendering under high temperature conditions also facilitates vaporization of the silane coupling agents, organic peroxides and other stabilizers, and therefore may cause reduction in adhesion, heat resistance and/or long-term reliability. Moreover, high temperature calendering may cause cracking in the solar cells and/or chipping in the thin-film electrodes at the time of the solar cell module lamination process.

When the α-olefin unit content exceeds 19.99 mol %, on the other hand, the resin composition becomes sticky, and therefore the calendered sheet easily adheres to the surface of calender rolls. Thus, release of the sheet from the calender rolls may become difficult, making it difficult to provide a uniform-thick sheet of the solar cell enpasulant material. When the sheet becomes sticky, blocking tends to occur which deteriorates sheet feedability. Moreover, there is concern that crosslinking is insufficient which reduces heat resistance.

The structural unit derived from an non-conjugated polyene (hereinafter also referred to as "non-conjugated polyene unit") contained in the ethylene/α-olefin/non-conjugated polyene copolymer is present in an amount of 0.01-5.0 mol %, preferably 0.01-4.5 mol %, and more preferably 0.05-4.0 mol %. When the non-conjugated polyene unit content is less than 0.01 mol %, it may result in inferior crosslinking characteristics. When the non-conjugated polyene unit content exceeds 5 mol %, on the other hand, long branched chains tend to occur in the ethylene/α-olefin/non-conjugated polyene copolymer, and/or the ethylene/α-olefin/non-conjugated polyene copolymer tends to be gelated. Thus, unwanted gel-like matter may occur in the solar cell encapsulant sheet, which deteriorates sheet appearance.

(Requirements a2))

The melt flow rate (MFR) of the ethylene/α-olefin/non-conjugated polyene copolymer, as measured in accordance with ASTM D1238 at 190° C. under a load of 2.16 kg, is typically 2 g/10 min or higher and preferably 2.5 g/10 min or higher, and is typically less than 10 g/10 min and preferably less than 9.5 g/10 min. The MFR of the ethylene/α-olefin/non-conjugated polyene copolymer can be adjusted by adjusting the polymerization temperature, polymerization pressure, molar ratio of ethylene and α-olefin in the polymerization system, and/or the like during polymerization to be described later.

When the MFR is less than 2 g/10 min, a resin composition containing the ethylene/α-olefin/non-conjugated polyene copolymer has a high modulus of elasticity. Thus, for calendering, more kneading is required in order to ensure homogeneous dispersion of additives in the resin composition. Moreover, when the MFR is less than 2 g/10 min, the resin composition is prone to scorching and is easily gelated resulting in the generation of irregularity on the surface of a molded article (or sheet) due to the presence of gel-like matter, and therefore sheet appearance may be deteriorated. Application of voltage to such a molded article causes cracking around the gel-like matter, and therefore dielectric breakdown strength decreases. Moisture permeation easily occurs at the interface of the gel-like matter, and therefore moisture permeation resistance decreases. Due to high modulus of elasticity, the resin composition may not be easily molded into a sheet and/or thickness control may become difficult. The irregularity generated on the sheet surface may deteriorate adhesion to glass, solar cells, electrodes, and backsheet during the solar cell module lamination process, resulting in insufficient adhesion and/or cracking in the solar cell.

On the other hand, when MFR exceeds 10 g/10 min, the copolymer has a low molecular weight as well as low modulus of elasticity; therefore, the resin composition adheres to the calender roll surface making sheet separation difficult. Thus, formation of sheet with uniform thickness tends to become difficult. Moreover, when MFR exceeds 10 g/10 min, the melt may fail to wrap around only one of two adjacent calender rolls but wraps around both the two calender rolls so as to split (hereinafter also referred to as "melt splitting"), and/or the melt may fall due to its weight. The resin composition also loses "stiffness," and therefore is not easily molded into a thick sheet with a thickness of, for example, 0.3 mm or more.

(Requirements a3))

The Shore A hardness of the ethylene/α-olefin/non-conjugated polyene copolymer as measured in accordance with ASTM D2240 is 60-85, preferably 60-83, and more preferably 65-80. The Shore A hardness of the ethylene/α-olefin/non-conjugated polyene copolymer can be adjusted for example by setting the ethylene unit content in the ethylene/α-olefin/non-conjugated polyene copolymer within the range described above. Namely, a high-density ethylene/α-olefin/non-conjugated polyene copolymer having high ethylene unit content exhibits a high Shore A hardness. On the other hand, a low-density ethylene/α-olefin/non-conjugated polyene copolymer having a low ethylene unit content exhibits a low Shore A hardness.

When Shore A hardness is less than 60, ethylene content is low (i.e., α-olefin content and non-conjugated polyene content are high). For this reason, during the calendering process the sheet easily adheres to the calender roll surface. Thus, release of the sheet from the calender rolls may become difficult, making it difficult to provide a uniform-thick sheet of the solar cell enpasulant material. Since the sheet becomes sticky, blocking tends to occur which deteriorates sheet feedability. Moreover, when the Shore A hardness is less than 60, there is concern that crosslinking is insufficient which cause reduction of heat resistance of the encapsulant.

On the other hand, when Shore A hardness exceeds 85, the copolymer has a high crystallinity, and therefore tends to exhibit reduced transparency. Moreover, during the calendering process the molten ethylene/α-olefin/non-conjugated polyene copolymer in the rolling bank cannot be easily fed between the calender rolls at the calender nip, and/or wrapping of the melt around the calender rolls worsens. Accordingly, the calendering process needs to be carried out at high temperatures (e.g., 100° C. or above). When the calendering process is carried out at high temperatures, organic peroxides compounded in the ethylene/α-olefin/non-conjugated polyene copolymer facilitates crosslinking reactions of the copolymer, generating unwanted gel-like matter in the solar cell encapsulant and therefore sheet appearance tends to be deteriorated. Calendering under high temperature conditions also facilitates vaporization of the silane coupling agents, organic peroxides and other stabilizers and therefore may cause reduction in adhesion, heat resistance and/or long-term reliability. Moreover, high temperature calendering may cause cracking in the solar cells and/or chipping in the thin-film electrodes during the solar cell module lamination process.

Preferably, the ethylene/α-olefin/non-conjugated polyene copolymer also satisfies the requirements a5)-a10) described below.

(Requirement a5))

The B value of the ethylene/α-olefin/non-conjugated polyene copolymer, as calculated from a $^{13}$C-NMR spectrum and the following formula (1), is preferably 0.9-1.3, more preferably 0.95-1.3 and still more preferably 0.95-1.2.

$$B=(c+d)/(2\times a\times(e+f)) \quad (1)$$

where "a" denotes a ratio of ethylene unit (molar fraction of ethylene) in the ethylene/α-olefin/non-conjugated polyene copolymer; "c" denotes a ratio of ethylene/α-olefin chain unit (molar fraction of ethylene/α-olefin dyad sequence); "d" denotes a ratio of ethylene/non-conjugated polyene chain (molar fraction of ethylene/non-conjugated polyene dyad sequence); "e" denotes a ratio of α-olefin unit (molar fraction of α-olefin); and "f" denotes a ratio of non-conjugated polyene unit (molar fraction of non-conjugated polyene).

The molar fractions "a", "c", "d", "e", and "f" in the formula can be determined from a $^{13}$C-NMR spectrum based on the teachings of the reports by J. C. Randall (Macromolecules and 15,353 (1982)) and J. Ray (Macrimolecules, 10, 773 (1977)). Their reports identify a dyad sequence of the polymer backbone (methylene groups) in the polymer backbone from a $^{13}$C-NMR spectrum of a copolymer consisting of ethylene and propylene, and associate the randomness and block nature of the copolymer with the copolymer's sequence.

In Equation (1), the molar fractions of α-olefin/non-conjugated polyene dyad sequence and the non-conjugated polyene/non-conjugated polyene dyad sequence are both small enough to be ignored. The molar fraction of ethylene/non-conjugated polyene dyad sequence is twice as large as the molar fraction of non-conjugated polyene.

The molar fractions of the respective components of the ethylene/α-olefin/non-conjugated polyene copolymer were separately calculated from the absorption intensity of a particular carbon of the non-conjugated polyene; the molar fraction of ethylene/non-conjugated polyene dyad sequence was calculated in this way. An assignment of the chain by the other methylene carbon was done in accordance with the above-mentioned literatures.

The B value can be adjusted by changing the polymerization catalyst used for the preparation of the ethylene/α-olefin/non-conjugated polyene copolymer by polymerization. More specifically, a copolymer having a B value that falls within the numerical value ranges can be obtained using a metallocene compound described later. The larger the B value, the shorter the block of ethylene or α-olefin units, the more the ethylene units, α-olefin units and non-conjugated polyene units are uniformly distributed and the narrower the units distribution of the ethylene/α-olefin/non-conjugated polyene copolymer.

When the B value is less than 0.9, the units distribution of the ethylene/α-olefin/non-conjugated polyene copolymer broadens. In particular, the block of ethylene units becomes long and therefore the copolymer exhibits high crystallinity and tends to show reduced transparency. Moreover, during the calendering process the molten ethylene/α-olefin/non-conjugated polyene copolymer in the rolling bank cannot be easily fed between the calender rolls at the calender nip, and/or wrapping of the melt around the calender rolls worsens. Accordingly, the calendering process needs to be carried out at high temperatures (e.g., 100° C. or above), and organic peroxides compounded facilitates crosslinking reactions of the ethylene/α-olefin/non-conjugated polyene copolymer, generating unwanted gel-like matter in the solar cell encapsulant, and therefore sheet appearance tends to be deteriorated. Calendering under high temperature conditions also facilitates vaporization of the silane coupling agents, organic peroxides and other stabilizers, and therefore may cause reduction in adhesion, heat resistance and/or long-term reliability. Moreover, high temperature calendering may cause cracking in the solar cells and/or chipping in the thin-film electrodes at the time of solar cell module lamination process.

The following describes a specific method of determining a B value for a non-conjugated cyclic polyene copolymer, which corresponds to the ethylene/α-olefin/non-conjugated polyene copolymer, prepared from ethylene, propylene and 5-ethylidene-2-norbornene (ENB).

Integral values of the NMR peaks of 9 different methylene carbons shown in the following structure were determined.
(1) αβ, (2) αγ+αδ, (3)βγ, (4) βδ, (5) βδ, (6) δδ, (7) 3E, (8) 3Z, (9) αα+1Z+5E+5Z+6E+6Z

[Formula 1]

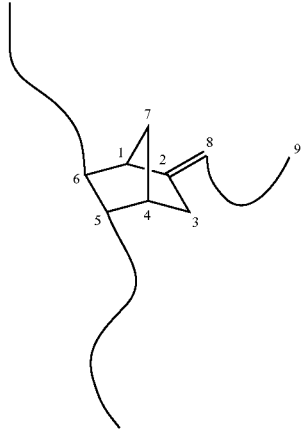

A symbol consisting of number(s) and alphabetic character(s) in (7) to (9) represents a carbon derived from ENB. The numbers (1) to (9) represent the positions of carbons in the structural formula, and "E" represents E isomer and "Z" represents Z isomer. Greek characters indicate the positions of methylene carbon atoms between two carbon atoms contained in the main chain, the two carbon atoms being bonded to methyl groups and being closest to each other. A methylene carbon atom adjacent to a carbon atom bonded to the methyl group is designated as "α." For example, a certain methylene carbon atom contained in the main chain is designated as "αγ," the certain methylene carbon atom being adjacent to a carbon atom bonded to one of the methyl groups and is the third carbon atom from a carbon atom bonded to the other of the methyl groups.

Identification of the NMR peaks was done in accordance with the teachings of the above-mentioned literatures.

For (2), a total of the integral values of a plurality of peaks near 37-39 ppm was calculated; for (6), a total of the integral values of a plurality of peaks near 29-31 ppm was calculated and integral values of γγ peak and γδ peak were subtracted from the total; and for (9), a total of the integral values of a plurality of peaks near 44-48 ppm was calculated.

αα was calculated as follows:

$$\alpha\alpha=\alpha\alpha+1Z+5E+6E+6Z-2\times3E-3\times3Z=(9)-2\times(7)-3\times(8)$$

Subsequently, 6 dyad sequences obtained from the three different monomers were measured for their integral value based on the calculated integral values as follows. Note that the dyad sequence NN (ENB-ENB chain) and dyad sequence NP (ENB-propylene chain) derived from ENB, which is a trace component, were ignored. The integral value for the dyad sequence NE was assumed to be twice the value corresponding to a molar fraction calculated from absorption intensity assigned to a carbon atom on the ring of ENB.

PP(propylene-propylene chain)=αα+αβ/4

PE(propylene-ethylene chain)=αγ+αδ+αβ/2

EE(ethylene-ethylene chain)=(βδ+δδ)/2+(γδ+βγ)/4

NE(ENB-ethylene chain)=(3$E$+3$Z$)×2

The molar fractions of the components were determined as follows:

"$a$(molar fraction of ethylene)"=(EE+PE/2)/(PP+PE+EE+3$E$+3$Z$)

"$c$(molar fraction of ethylene/α-olefin dyad sequence)"=PE/(PP+PE+EE+NE)

"$d$(molar fraction of ethylene/non-conjugated polyene dyad sequence)"=NE/(PP+PE+EE+NE)

"$e$(molar fraction of α-olefin)"=(PP+PE/2)/(PP+PE+EE+3$E$+3$Z$)

"$f$(molar fraction of non-conjugated polyene)"=(3$E$+3$Z$)/(PP+PE+EE+3$E$+3$Z$)

The molar fractions of the composition as calculated above are substituted into Equation (1) to give the following Equation (A) to find a B value.

$B$=[(PE+NE)/(PP+PE+NE+EE)]/[(EE+PE/2)[(PP+PE/2)+(3$E$+3$Z$)]/(PP+PE+EE+3$E$+3$Z$)$^2$]       (A)

A larger B value obtained by Equation (A) indicates that the block of ethylene or α-olefin (propylene) units is shorter and the α-olefin (propylene) units and non-conjugated polyene units are more uniformly distributed in the ethylene/α-olefin/non-conjugated polyene copolymer. On the other hand, a smaller B value indicates that the distribution of the non-conjugated polyene units is less uniform and the block of the non-conjugated polyene units is longer.

(Requirement a6))

A maximum value Pmax and a minimum value Pmin of ethylene distribution parameter P of the ethylene/α-olefin/non-conjugated polyene copolymer as measured by GPC-offline-FTIR preferably satisfy the relationship Pmax/Pmin≤1.4, more preferably the relationship Pmax/Pmin=1.0-1.4. Pmax/Pmin of the ethylene/α-olefin/non-conjugated polyene copolymer can be adjusted by obtaining the copolymer by a polymerization reaction catalyzed by a metallocene compound (described later).

"Ethylene distribution parameter P" can be measured in accordance with the procedure described below. A test sample obtained by dissolving the ethylene/α-olefin/non-conjugated polyene copolymer in cyclohexane is subjected to measurement with GPC-offline-FTIR using cyclohexane as eluent at an eluent flow rate of 1.0 mL/min and at 60° C. In the resultant IR spectrum a peak ratio (A721 cm$^{-1}$/A4320 cm$^{-1}$) of a maximum peak intensity in the range of 721±20 cm$^{-1}$ (A721 cm$^{-1}$) to a maximum peak intensity in the range of 4,320±20 cm$^{-1}$ (A4320 cm$^{-1}$) is defined as ethylene distribution parameter P. Pmax and Pmin can be obtained from ethylene distribution parameter P.

Ethylene distribution parameter P can be an indicator of the ethylene unit content in the ethylene/α-olefin/non-conjugated polyene copolymer in the measured fraction. A larger P value indicates a higher ethylene unit content in the copolymer. The maximum peak (A721 cm$^{-1}$) in the range of 721±20 cm$^{-1}$ in the IR spectrum is considered to indicate a peak derived from C—H rocking vibration of the ethylene unit. The maximum peak (A4320 cm$^{-1}$) in the range of 4,320±20 cm$^{-1}$ in the IR spectrum is considered to indicate a peak derived from C—H deformation vibration common to the olefin structure.

When Pmax/Pmin falls within the above-described range, there is a small difference in ethylene unit content between the high molecular component and low molecular component within the ethylene/α-olefin/non-conjugated polyene copolymer, and therefore the copolymer exhibits a uniform composition distribution. When Pmax/Pmin exceeds the above-described range, in particular, the ethylene unit content of the high molecular component is high, and thus during the calendering process the molten ethylene/α-olefin/non-conjugated polyene copolymer in the rolling bank cannot be easily fed between the calender rolls at the calender nip, and/or wrapping of the melt around the calender rolls worsens. Accordingly, the calendering process needs to be carried out at high temperatures (e.g., 100° C. or above). When the calendering process is carried out at high temperatures, organic peroxides compound facilitates crosslinking reactions of the ethylene/α-olefin/non-conjugated polyene copolymer, generating unwanted gel-like matter in the solar cell encapsulant and therefore sheet appearance tends to be deteriorated. Calendering under high temperature conditions also facilitates vaporization of the silane coupling agents, organic peroxides, and other stabilizers and therefore may cause reduction in adhesion, heat resistance and/or long-term reliability. Moreover, high temperature calendering may cause cracking in the solar cells and/or chipping in the thin-film electrodes at the time of the solar cell module lamination process.

(Requirement a7))

The activation energy (Ea) of fluidization of the ethylene/α-olefin/non-conjugated polyene copolymer is preferably 28-45 kJ/mol, more preferably 28-43 kJ/mol, and particularly preferably 28-42 kJ/mol. The activation energy (Ea) of fluidization is a measure of the extent of long-chain branching in the ethylene/α-olefin/non-conjugated polyene copolymer. When the activation energy (Ea) of fluidization is less than 28 kJ/mol, the extent of long-chain branching is low in the ethylene/α-olefin/non-conjugated polyene copolymer, which may result in low crosslinking efficiency resulting in low heat resistance. Moreover, adhesion strength may decrease. When the activation energy (Ea) of fluidization exceeds 28 kJ/mol, the extent of long-chain branching is high in the ethylene/α-olefin/non-conjugated polyene copolymer, so that a resin composition containing the copolymer has a large contractility and therefore a width of the calendered sheet tends to become small. Moreover, the resin composition is prone to scorching and is easily gelated, which results in the formation of irregularity on the surface of a molded article (or sheet) due to the presence of gel-like matter and sheet appearance may be deteriorated. Application of voltage to such a molded article causes cracking around the gel-like matter, and therefore dielectric breakdown strength decreases. Moisture permeation easily occurs at the interface of the gel-like matter and therefore moisture permeation resistance decreases. The irregularity generated on the sheet surface may deteriorate adhesion to glass, solar cells, electrodes, and backsheet during the solar cell module lamination process, resulting in insufficient adhesion.

Activation energy of fluidization will now be described. In general, the viscosity of a molten polymer decreases with increasing temperature as with rheologically simple liquids. For example, temperature dependence of viscosity ([η]0) is known to follow an Arrhenius type equation represented by the following formula (1) at a temperature 100° C. higher than glass transition temperature (Tg).

$$\text{Viscosity}(\eta 0) = A\exp(Ea/RT) \tag{i}$$

where "R" is gas constant, "A" is frequency factor, "Ea" is activation energy of fluidization, and "T" is absolute temperature.

The activation energy of fluidization is independent of molecular weight and molecular weight distribution, and is influenced solely by the molecular structure. Therefore, the activation energy of fluidization serves as a useful indicator that provides structural information of a polymer.

In the case of an olefin-based polymer produced by using a Ziegler catalyst, it is difficult to control the molecular structure accurately, so that the activation energy of fluidization including various structural information has been calculated. However, development and progress in the production technology of metallocene catalysts have enabled controlling of the composition distribution, the molecular weight distribution, and the extents of short-chain branching and long-chain branching. The activation energy of fluidization of high density polyethylene (HDPE) is known to be about 27 kJ/mol, and about 56 kJ/mol for low-density polyethylene (LDPE).

It has been reported that in an ethylene/α-olefin/non-conjugated polyene copolymer produced using a metallocene catalyst, the copolymerized diene components are uniformly distributed in the molecular structure of the ethylene/α-olefin/non-conjugated polyene copolymer (B. A. Harrington and M. G. Williams, "American Chemical Society Rubber Division Technical Meeting", October 2003, p. 14-17). That is, it becomes possible to control the molecular structure of the EPDM accurately by using the metallocene catalyst and, at the same time, it becomes possible to level the cross-linking activity. In other words, the relationship between the activation energy of fluidization and any of the properties of the rubber composition, the cross-linked rubber and the cross-linked foam can be grasped.

It is believed that a difference in activation energy of fluidization results from long chain branching, and analysis of long chain branching has been conducted by a nuclear magnetic resonance (NMR) method or light scattering method. However, accurate results are not always attained. Consequently, intensive research has been still conducted focusing on rheological characteristics ("Seikei-Kakou", Vol. 20, No. 7, p. 400-404 (2008), by Masayuki Yamaguchi, and "Macromolecular Chemistry and Physics", Vol. 208, p. 2449-2454 (2007), by F. J. Stadler, C. Gabriel, and H. Munstedt).

An ethylene/α-olefin/non-conjugated polyene copolymer having an activation energy of fluidization that satisfies the above-mentioned range can be prepared by introducing the diene components uniformly into the polymer through the use of the metallocene catalyst described later. For example, the extent of long chain branches is changed by increasing or decreasing the ratio of a non-conjugated polyene comonomer having a terminal double bond (e.g., 5-vinyl-2-norbornene (VNB)), so that the activation energy of fluidization is adjusted to a desired level. The activation energy (Ea) of fluidization is a numerical value calculated using an Arrhenius type equation based on the shift factor (aT) in the formation of a master curve indicating the dependence of the melt complex viscosity (unit: Pa·sec) at 190° C. on the frequency (unit: rad/sec), on the basis of the temperature-time superposition principle.

A method for determining activation energy (Ea) of fluidization will now be described. The temperature-time superposition principle is used to determine the shift factor (aT). Melt complex viscosity-frequency curves for the etylene/α-olefin/non-conjugated polyene copolymer at 170° C. and 210° C. (T, unit: ° C.) are superimposed to the melt complex viscosity-frequency curve at 190° C. A linear approximation (I) of ln(aT) with respect to 1/(T+273.16) is obtained by the method of least square from temperatures (T) and from shift factors (aT) at the respective temperatures (T). Subsequently, Ea is determined from the gradient m of the above-described linear approximation (I) and equation (II) described below.

$$\ln(aT) = m[1/(T+273.16)] + n \tag{I}$$

$$Ea = 0.008314 \times m \tag{II}$$

aT: Shift factor
Ea: activation energy of fluidization (unit: kJ/mol)
T: temperature (° C.)
n: Y axis intercept The above-described calculation is conducted using for example commercially available calculation software (RSI Orchestrator VER. 6.6.3; by TA Instruments Japan Inc.). The shift factor (aT) is the amount of shift that is required for the curve of the melt complex viscosity-frequency (log-log) at 170° C. or 210° C. to be shifted along log(Y)=−log(X) axis (where Y axis is melt complex viscosity and X axis indicates frequency) and are superimposed on the melt complex viscosity-frequency curve at 190° C. In the superimposition, the log-log curve of the melt complex viscosity-frequency at each temperature (T) is shifted in such a way that the frequency is multiplied by a factor of aT and that the melt complex viscosity is multiplied by a factor of 1/aT. The correlation coefficient upon determination of linear approximation (I) obtained by the method of least square from shift factors (aT) at 170° C., 190° C. and 210° C. and temperatures is typically 0.99 or more.

The melt complex viscosity-frequency curves are created using a viscoelasticity meter described below. The test specimen used is prepared by pressing the ethylene/α-olefin/non-conjugated polyene copolymer at 190° C. to prepare a 2 mm-thick sheet and stamping the sheet into a disk shape having a diameter of 25 mm.

The test specimen may contain an appropriate amount (e.g., about 1,000 ppm) of antioxidant.

Viscoelasticity meter: RDS-2 (Rheometric Scientific)
Measurement condition is:
  Geometry: Parallel plate
  Measurement temperature: 170° C., 190° C., 210° C.
  Frequency: 0.5-79.577 Hz
  Distortion factor: 1.0%

The frequency dependence of viscosity is measured under the above-described condition, and the activation energy of fluidization is calculated using the above-described Arrhenius type equation. RSI Orchestrator VER. 6.6.3 (TA Instruments Japan Inc.) can be used as data processing software. The copolymer having the above-described specific activation energy (Ea) of fluidization can be obtained by adjusting the non-conjugated polyene unit content in the ethylene/α-olefin/non-conjugated polyene copolymer.

(Requirement a8))

The molecular weight distribution Mw/Mn, a ratio of weight-average molecular weight (Mw) to number-average molecular weight (Mn) as measured by gel permeation chromatography (GPC), of the ethylene/α-olefin/non-conjugated polyene copolymer is preferably 1.2-3.5, more preferably 1.7-3.0, still more preferably 1.7-2.7, and particularly preferably 1.9-2.4. The molecular weight distribution Mw/Mn may be adjusted within a desired range by producing the ethylene/

α-olefin/non-conjugated polyene copolymer by a polymerization reaction catalyzed by a metallocene compound described later.

In order to set molecular weight distribution Mw/Mn to less than 1.2, the monomers of the ethylene/α-olefin/non-conjugated polyene copolymer need to be polymerized in a "living" polymerization manner; however, living polymerization cannot provide sufficient productivity. In order to set molecular weight distribution Mw/Mn to less than 1.2, low-molecular weight components and/or high-molecular weight components need to be separated from the ethylene/α-olefin/non-conjugated polyene copolymer produced by a known polymerization process, which results in high manufacturing costs. Moreover, the temperature window within which calendering is possible is narrowed, result in making it difficult to provide a uniform thick sheet and to mold sheet.

On the other hand, when molecular weight distribution Mw/Mn exceeds 3.5, since the amount of low-molecular weight component is high, the sheet becomes sticky, and therefore blocking tends to occur which deteriorates sheet feedability. It is generally known that the unit distribution broadens as the molecular weight distribution Mw/Mn broadens. Thus, the calendered sheet easily adheres to the surface of calender rolls making it difficult to release the sheet from the calender rolls, which tends to make it difficult to provide a solar cell encapsulant sheet with uniform thickness. Moreover, "melt splitting" may occur. There is also concern that crosslinking is insufficient which reduces heat resistance. Low-molecular weight components bleed to the surface of the film, inhibiting sheet adhesion and therefore adhesion may decrease.

The ratio Mw/Mn of weight-average molecular weight (Mw) to number-average molecular weight (Mn) is measured as described below using a gel permeation chromatograph (Alliance GPC-2000, Waters). Separation columns used were TSKgel GMH6-HT×2 plus SKgel GMH6-HTL×2. The column size was 7.5 mm in inner diameter and 300 mm in length, with the column temperature set to 140° C. Orthodichlorobenzene (Wako Pure Chemical Industries, Ltd.) was employed as an eluent with 0.025 wt % of BHT (butylhydroxytoluene, Takeda Pharmaceutical Co., LTd.) added as an antioxidant. The eluent was pumped at a flow rate of 1.0 ml/min. The sample concentration was 15 mg/10 ml, and the injection volume was set at 500 µl. As a detector a differential refractometer was employed. The polystyrene standards used were products from Tosoh Corporation for molecular weight ranges of Mw≤1,000 and Mw≥4×$10^6$, and products from Pressure Chemical Company for a molecular weight range of 1,000≤Mw≤4×$10^6$. The universal calibration curve is generated using the polystyrene standards to calculate the molecular weights in terms of ethylene/α-olefin/non-conjugated polyene copolymer for different α-olefins used.

(Requirement a9))

The chlorine ion content in the eluate from the solid-phase-extraction of the ethylene/α-olefin/non-conjugated polyene copolymer as detected by ion chromatography is preferably 2 ppm or less, more preferably 1.5 ppm or less, and most preferably 1.2 ppm or less. The chlorine ion content can be adjusted by adjusting the structure of a metallocene compound (later described) and polymerization conditions. Specifically, by enhancing the polymerization activity of a polymerization catalyst, the residual amount of catalyst in the ethylene/α-olefin/non-conjugated polyene copolymer is reduced resulting in an ethylene/α-olefin/non-conjugated polyene copolymer having a chlorine ion content that falls within the above-described ranges. Further, the use of a chlorine-free metallocene compound can provide an ethylene/α-olefin/non-conjugated polyene copolymer that is substantially free from chlorine ions.

When the chlorine ion content in the ethylene/α-olefin/non-conjugated polyene copolymer exceeds 2 ppm, it may result in corrosion of the electrode (composed of silver and the like) of the solar cell and thus may reduce the long-term reliability of the solar cell module.

The chlorine ion content in the ethylene/α-olefin/non-conjugated polyene copolymer can be measured for example as follows: Approximately 10 g of the copolymer is precisely weighed into a glass container sterilized in an autoclave or other device, 100 ml of ultrapure water is added, the glass container is sealed air-tight, the sample is subjected to ultrasonic extraction (38 kHz) for 30 minutes at ambient temperature, and the resultant extract liquid is measured for chlorine ion content using chromatography ICS-2000 (Dionex).

(Requirement a10))

The amount of the ethylene/α-olefin/non-conjugated polyene copolymer extracted into methyl acetate is preferably 5.0 wt % or less, more preferably 4.0 wt % or less, still more preferably 3.5 wt % or less, and most preferably 2.0 wt % or less. A higher amount of the copolymer extracted into methyl acetate indicates abundance of low-molecular weight components in the ethylene/α-olefin/non-conjugated polyene copolymer. This also indicates a broadened molecular weight distribution or unit distribution.

By adjusting the polymerization condition using a metallocene compound (later described), it is possible to provide an ethylene/α-olefin/non-conjugated polyene copolymer that is less extracted into methyl acetate. For example, removal of metallocene compounds with reduced polymerization activity from the polymerization system by shortening the polymerization retention time in the polymerization vessel can reduce the generation of low-molecular weight components. When the amount of copolymer extracted into methyl acetate by Soxhlet-extraction exceeds 5.0 wt %, the sheet becomes sticky, and therefore blocking tends to occur which deteriorates sheet feedability.

It is generally known that a polymer with a large molecular weight distribution Mw/Mn has a broad unit distribution. Thus, the calendered sheet easily adheres to the surface of calender rolls. Release of the sheet from the calender rolls may thus become difficult, making it difficult to provide a uniform-thick sheet of the solar cell enpasulant material. Since the sheet becomes sticky, blocking tends to occur which deteriorates sheet feedability. There is also concern that crosslinking is insufficient which reduces heat resistance. Low-molecular weight components bleed to the surface of the film, inhibiting sheet adhesion and therefore adhesion may decrease.

The amount of the ethylene/α-olefin/non-conjugated polyene copolymer extracted into methyl acetate is measured for example by weighing approximately 10 g of the copolymer into methyl acetate, subjecting the sample to Soxhlet extraction at a temperature equal to or above the solvent boiling point, and measuring either the difference in weight of the copolymer between before and after extraction, or the amount of residue from which extraction solvent has been evaporated.

(Melt Peak)

The melt peak of the ethylene/α-olefin/non-conjugated polyene copolymer based on differential scanning calorimetry (DSC) preferably appears within a range of 30-90° C., more preferably within a range of 33-90° C., and most preferably within a range of 30-88° C.

When the melt peak appears at a temperature above 90° C., the copolymer has a high crystallinity and therefore tends to exhibit reduced transparency. Moreover, during the calendering process the molten ethylene/α-olefin/non-conjugated polyene copolymer in the rolling bank cannot be easily fed between the calender rolls at the calender nip, and/or wrapping of the melt around the calender rolls worsens. Accordingly, the calendering process needs to be carried out at high temperatures (e.g., 100° C. or above). When the calendering process is carried out at high temperatures, organic peroxides compound facilitates crosslinking reactions of the ethylene/α-olefin/non-conjugated polyene copolymer, generating unwanted gel-like matter in the solar cell encapsulant and therefore sheet appearance tends to be deteriorated. Calendering under high temperature conditions also facilitates vaporization of the silane coupling agents, organic peroxides and other stabilizers and therefore may cause reduction in adhesion, heat resistance and/or long-term reliability. Moreover, high temperature calendering may cause cracking in the solar cells and/or chipping in the thin-film electrodes at the time of the solar cell module lamination process.

When the melt peak appears below 30° C., the calendered sheet easily adheres to the surface of calender rolls. Release of the sheet from the calender rolls may thus become difficult making it difficult to provide a uniform-thick sheet of the solar cell enpasulant material. Since the sheet becomes sticky, blocking tends to occur which deteriorates sheet feedability. There is also concern that crosslinking is insufficient which reduces heat resistance.

(Crystallinity)

The crystallinity of the ethylene/α-olefin/non-conjugated polyene copolymer is preferably low; more preferably, crystallinity measured by X-ray diffraction is 40% or less. In order to reduce the crystallinity of the ethylene/α-olefin/non-conjugated polyene copolymer, the α-olefin content may be increased, for example. From the perspective of avoiding blocking, on the other hand, the ethylene/α-olefin/non-conjugated polyene copolymer is preferably low crystalline rather than completely amorphous. The reason for this is that a low crystalline ethylene/α-olefin/non-conjugated polyene copolymer exhibits superior flexibility and/or transparency.

(Production Process of Ethylene/α-olefin/Unconjugated Polyene Copolymer)

The ethylene/α-olefin/non-conjugated polyene copolymer can be produced by a polymerization reaction catalyzed by a variety of the following metallocene compounds as a catalyst, Metallocene compounds are disclosed for example in JP-A Nos. 2006-077261, 2008-231265, 2005-314680, and 2009-138076. Metallocene compounds that have different structures from those of the metallocene compounds disclosed in these patent literatures may be employed, and two or more different metallocene compounds may be used in combination.

One preferable example of a polymerization reaction catalyzed by a metallocene compound is the following polymerization reaction. Monomers are supplied in the presence of an olefin polymerization catalyst consisting of known metallocene compound (I) and at least one compound (also called catalyst promoter (II)) selected from organic aluminum oxy compound (II-1), compound (II-2) which forms an ion pair with metallocene compound (I), and organoaluminum compound (II-3).

Non-exclusive examples of organic aluminum oxy compound (II-1), compound (II-2) which forms an ion pair with metallocene compound (I), and organoaluminum compound (II-3) are disclosed for example in JP-A Nos. 2006-077261, 2008-231265, and 2005-314680. These catalyst promoters (II) may be individually charged in the polymerization atmosphere or may be previously allowed to contact one another before being charged into the polymerization atmosphere. These catalyst promoters (II) may also be loaded on a microparticulate inorganic oxide disclosed for example by JP-A No. 2005-314680.

By employing a polymerization reaction substantially without using metallocene compound (I) and compound (II-2) which forms an ion pair with metallocene compound (I), it is possible to provide an ethylene/α-olefin/non-conjugated polyene copolymer that exhibits superior electrical characteristics.

The metal content and ion content in the polymer produced in a polymerization system catalyzed by a known Ziegler-Natta catalyst and a organoaluminum compound (II-3) can be reduced by treatment with acid or the like. It is thus possible to provide an ethylene/α-olefin/non-conjugated polyene copolymer that exhibits superior electrical characteristics. However, when the ethylene/α-olefin/non-conjugated polyene copolymer subjected to treatment with acid or the like is used as a solar cell encapsulant, the residual acid or alkali in the copolymer tends to corrode the electrodes of the solar cell module. Treatment with acid or the like also increases the production cost of the ethylene/α-olefin/non-conjugated polyene copolymer.

For the reasons described above, the ethylene/α-olefin/non-conjugated polyene copolymer is preferably produced using an olefin polymerization catalyst consisting of metallocene compound (I) and at least one compound selected from organic aluminum oxy compound (II-1) and organoaluminum compound (II-3).

The polyermerization reaction by which the ethylene/α-olefin/non-conjugated polyene copolymer is produced can be accomplished by any of the gas-phase polymerization methods and liquid-phase polymerization methods such as slurry polymerization or solution polymerization which are known in the art, but is preferably accomplished by a liquid-phase polymerization method such as solution polymerization. When the ethylene/α-olefin/non-conjugated polyene copolymer is prepared by copolymerization of ethylene, a $C_{3-20}$ α-olefin and a non-conjugated polyene using the above-described metallocene compound, the amount of the metallocene compound (I) in the reaction system is typically $10^{-9}$-$10^{-1}$ mol, preferably $10^{-8}$-$10^{-2}$ mol, per liter reaction volume.

The amount of compound (II-1) in the reaction system is adjusted such that the mole ratio [(II-1)/M] of compound (II) to total transition metal atom (M) is 1-10,000, preferably 10-5,000. The amount of compound (II-2) in the reaction system is adjusted such that the mole ratio [(II-2)/M] of compound (I) to total transition metal atom (M) is 0.5-50, preferably 1-20. The amount of compound (II-3) in the reaction system is adjusted to 0-5 mmol, preferably about 0-2 mmol, per litter reaction volume.

By copolymerizing ethylene, a $C_{3-20}$ α-olefin and a non-conjugated polyene by solution polymerization in the presence of a metallocene compound, it is possible to effectively produce an ethylene/α-olefin/non-conjugated polyene copolymer having a high comoner content, a narrow unit distribution, and a narrow molecular weight distribution. The charge mole ratio of ethylene, $C_{3-20}$ α-olefin and non-conjugated polyene is as follows: ethylene:$C_{3-20}$ α-olefin:non-conjugated polyene=10:90:1 to 99.9:0.1:0.01, preferably 30:70:1 to 99.9:0.1:0.01, and more preferably 50:50:1 to 99.9:0.1:0.01.

Examples of the $C_{3-20}$ α-olefin and non-conjugated polyene are as described above. The α-olefins usable for solution polymerization may be polar group-containing olefins. Examples of polar group-containing olefins include α,β-unsaturated carboxylic acids such as acrylic acid, methacrylic acid, fumaric acid and maleic anhydride, and metal salts (e.g., sodium salts) thereof; α,β-unsaturated carboxylic acid esters such as methyl acrylate, ethyl acrylate, n-propyl acrylate, methyl methacrylate, and ethyl methacrylate; vinyl esters such as vinyl acetate, and vinyl propionate; and unsaturated glycidyls such as metaglycidyl acrylate and glycidyl methacrylate. High-temperature solution polymerization can also be effected under the coexistence of vinylcyclohexane, diene or polyene; an aromatic vinyl compound such as styrene, including o-methylstyrene, m-methylstyrene, p-methylstyrene, o,p-dimethylstyrene, methoxy styrene, and vinylbenzoic acid, vinylmethyl benzoate or vinylbenzyl acetate, hydroxystyrene, p-chloro styrene, or divinylbenzene; or 3-phenylpropylene, 4-phenylpropylene or α-methylstyrene.

"Solution polymerization" is a generic term of polymerization methods in which polymerization is effected with a solute dissolved in a non-reactive hydrocarbon solvent to be described later. Polymerization temperature in solution polymerization is typically 0-200° C., preferably 20-190° C., and more preferably 40-180° C. When polymerization temperature in solution polymerization is below 0° C., it results in a significant reduction in the polymerization activity as well as difficulty in removing polymerization heat, which is not practical in terms of productivity. When polymerization temperature exceeds 200° C., it results in a significant reduction in the polymerization activity, which is not practical in terms of productivity.

Polymerization pressure in solution polymerization is typically from normal pressure to 10 MPa (gauge pressure), preferably from normal pressure to 8 MPa (gauge pressure). Copolymerization may be carried out in a batchwise, semi-continuous or continuous process. Reaction time (average residence time in cases where polymerization is carried out in a continuous process) varies depending on the reaction condition such as catalyst concentration or polymerization temperature and can be determined appropriately; reaction time is typically 1 minute to 3 hours, preferably 10 minutes to 2.5 hours. The polymerization reaction may also be carried out in two or more stages with different reaction conditions.

The molecular weight of the resultant ethylene/α-olefin/non-conjugated polyene copolymer may also be adjusted by changing the hydrogen concentration in the polymerizattion system and/or polymerization temperature. Alternatively, the molecular weight of the ethylene/α-olefin/non-conjugated polyene copolymer may be adjusted by means of the amount of catalyst promoter (II). When hydrogen is added, an appropriate amount of hydrogen is on the order of 0.001-5,000 NL per kilogram of the ethylene/α-olefin/non-conjugated polyene copolymer to be produced. The amount of vinyl group and vinylidene group present at the terminals of molecules of the resultant ethylene/α-olefin/non-conjugated polyene copolymer is adjusted by increasing the polymerization temperature or reducing the added amount of hydrogen as much as possible.

Solvents used in solution polymerization are typically non-reactive hydrocarbon solvents, preferably saturated hydrocarbons whose boiling point is 50-200° C. at normal pressure. Specific examples thereof include alicyclic hydrocarbons such as pentane, hexane, heptane, octane, decane, dodecane, and kerosene; and aliphatic hydrocarbons such as cyclopentane, cyclohexane, and methylcyclopentane. Aromatic hydrocarbons such as benzene, toluene, and xylene; and halogenated hydrocarbons such as ethylenechloride, chlorobenzene, and dichloromethane are also included in "non-reactive hydrocarbon solvents" and can be employed.

As described above, for solution polymerization, not only hydrocarbon-soluble organic aluminumoxy compounds often used in the art, but also modified methylaluminoxanes like MMAO which are soluble in aliphatic hydrocarbons and alicyclic hydrocarbon can be used. When an aliphatic or alicyclic hydrocarbon is used as a solvent for solution polymerization, there exists no aromatic hydrocarbon in the polymerization system and therefore it is possible to nearly completely eliminate possible contamination of the ethylene/α-olefin/non-conjugated polyene copolymer with aromatic hydrocarbons. For the reasons described above, solution polymerization can be a method that can reduce the environmental load and minimize negative impacts on the human health. In order to reduce fluctuations in physical properties, the ethylene/α-olefin/non-conjugated polyene copolymer produced by a polymerization reaction and optional components add as needed are preferably subjected to melting, kneading, granulation and the like using any method.

(Ethylene Resin Composition)

A solar cell encapsulation material of the present invention is composed of an ethylene resin composition which preferably contains 100 parts by weight of the above-described ethylene/α-olefin/non-conjugated polyene copolymer, 0.1-5.0 parts by weight of a silane coupling agent such as an ethylenically-unsaturated silane compound, and 0.1-2.5 parts by weight of a crosslinking agent such as an organic peroxide.

More preferably, the ethylene resin composition contains 0.1-4 parts by weight of an ethylenically-unsaturated silane compound and 0.2-2.5 parts by weight of an organic peroxide per 100 parts by weight of the ethylene/α-olefin/non-conjugated polyene copolymer. Still more preferably, the ethylene resin composition contains 0.1-3 parts by weight of an ethylenically-unsaturated silane compound and 0.2-2 parts by weight of an organic peroxide per 100 parts by weight of the ethylene/α-olefin/non-conjugated polyene copolymer.

(Ethylenic Ally-Unsaturated Silane Compound)

When the amount of an ethylenically-unsaturated silane compound in the ethylene resin composition is less than 0.1 parts by mass, it results in reduced adhesion. On the other hand, when the amount of an ethylenically-unsaturated silane compound in the ethylene resin composition exceeds 5 parts by mass, the balance between cost and performance of the solar cell encapsulant is not met. Moreover, when the ethylene resin composition contains an excessive amount of an ethylenically-unsaturated silane compound, the ethylene resin composition needs to contain an excessive amount of an organic peroxide correspondingly. The reason for this is that when the ethylene resin composition is cured, the ethylenically-unsaturated silane compound needs to be grafted to the ethylene/α-olefin/non-conjugated polyene copolymer. When the amount of the organic peroxide is small compared to the silane coupling agent, the silane coupling agent cannot be sufficiently grafted to the backbone of the ethylene/α-olefin/non-conjugated polyene copolymer, and therefore adhesion tends to decrease.

However, when the ethylene resin composition contains an excessive amount of an organic peroxide, the ethylene resin composition undergoes gelation upon manufacturing of a solar cell encapsulant sheet with a calendar machine, resulting in the formation of irregularity on the sheet surface due to the presence of gel-like matter and therefore sheet appearance may be deteriorated. Application of voltage to the sheet causes cracking around the gel-like matter and therefore dielectric breakdown strength decreases. Moisture permeation easily occurs at the interface of the gel-like matter, and therefore moisture permeation resistance decreases. The irregularity generated on the sheet surface may deteriorate adhesion to glass, solar cells, electrodes, and backsheet during the solar cell module lamination process, resulting in insufficient adhesion. Further, the ethylenically-unsaturated silane compound itself undergoes a condensation reaction to give a condensation product that appears as white streaks deteriorating the appearance of the encapsulant.

There are no particular limitations on the ethylenically-unsaturated silane compound; any of the ethylenically-unsaturated silane compounds known in the art can be used. Specific examples thereof include vinyltriethoxysilane, vinyltrimethoxysilane, vinyltris(beta-methoxyethoxysilane), γ-glycidoxypropyltrimetoxysilane, γ-aminopropyltriethoxysilane, and γ-methacryloxpropyltrimethoxy silane. Preferable examples are γ-glycidoxypropyltrimetoxysilane, γ-aminopropyl triethoxysilane, γ-methacryloxpropyl trimethoxy silane, vinyltriethoxysilane and the like, which can increase the adhesion of the ethylene resin composition.

(Organic Peroxide)

The organic peroxide acts as a radical initiator for graft-modification of the ethylene/α-olefin/non-conjugated polyene copolymer with an ethylenically-unsaturated silane compound. The organic peroxide also serves as a radical initiator for crosslinking the ethylene/α-olefin/non-conjugated polyene copolymer during the manufacture of a solar cell module with the laminated the solar cell encapsulant. Graft modification of the ethylene/α-olefin/non-conjugated polyene copolymer with an ethylenically-unsaturated silane compound enhances the adhesion of the encapsulant layers to the glass, backsheet, solar cells, and electrodes within the solar cell module. Crosslinking of the ethylene/α-olefin/non-conjugated polyene copolymer results in an encapsulant member that exhibits superior heat resistance and/or adhesion within the solar cell module.

When the organic peroxide content in the ethylene resin composition is less than 0.1 parts by weight, it results in reduced crosslinking characteristics (e.g., degree of crosslinking and/or crosslinking rate) of the solar cell encapsulant and/or insufficient graft modification of the backbone of the ethylene/α-olefin/non-conjugated polyene copolymer with an ethylenically-unsaturated silane compound, and therefore, heat resistance and adhesion decrease.

When the organic peroxide content in the ethylene resin composition exceeds 2.5 parts by weight, gelation may occur when the solar cell encapsulant is calendered into sheet using a calender machine, resulting in the formation of irregularity on the surface of the sheet due to the presence of gel-like matter, and therefore sheet appearance may be deteriorated. Application of voltage to the sheet causes cracking around the gel-like matter and therefore dielectric breakdown strength decreases. Moisture permeation easily occurs at the interface of the gel-like matter, and therefore moisture permeation resistance decreases. The irregularity generated on the sheet surface may deteriorate adhesion to glass, solar cells, electrodes, and backsheet during the solar cell module lamination process, resulting in insufficient adhesion. Crosslinking during solar cell module lamination excessively proceeds resulting in high thermal shrinkage, and therefore there are cases where the edge of the solar cell module fails to be sufficiently encapsulated by the solar cell encapsulant and/or where the solar cells crack due to excessively high thermal shrinkage. Moreover, when crosslinking excessively proceeds, degradation of the ethylene/α-olefin/non-conjugated polyene copolymer proceeds which may deteriorate heat resistance, color and/or flexibility.

Such an organic peroxide will suffice that allows for graft modification of the ethylene/α-olefin/non-conjugated polyene copolymer with an ethylenically-unsaturated silane compound and for crosslinking of the ethylene/α-olefin/non-conjugated polyene copolymer. From the perspective of the balance between calendering productivity and crosslinking rate during solar cell module lamination, it is preferable to employ an organic peroxide having a 1 minute half-life temperature of 100-170° C.

Organic peroxides having a 1 minute half-life temperature of below 100° C. trigger gelation during manufacture of a solar cell encapsulant sheet with a calendering machine. Irregularity may occur on the surface of the sheet due to the presence of gel-like matter and therefore sheet appearance may be deteriorated. Application of voltage to the sheet causes cracking around the gel-like matter and therefore dielectric breakdown strength decreases. Moisture permeation easily occurs at the interface of the gel-like matter and therefore moisture permeation resistance decreases. The irregularity generated on the sheet surface may deteriorate adhesion to glass, solar cells, electrodes, and backsheet during the solar cell module lamination process, resulting in insufficient adhesion. Moreover, when the solar cell encapsulant is used after long-term storage, there are cases where reactions of the organic peroxide take place and therefore crosslinking of the encapsulant proceeds during storage resulting in low flowability during the lamination process, and/or the amount of the organic peroxide is reduced which is used as an initiator of a graft reaction of the ethylenically-unsaturated silane compound, resulting in reduced adhesion.

Organic peroxides having a 1 minute half-life temperature of above 170° C. slow the crosslinking rate of the solar cell encapsulant when manufacturing a solar cell module by laminating the solar cell encapsulant, significantly reducing the productivity of the solar cell module. Such organic peroxides also reduce the heat resistance and adhesion of the solar cell encapsulant.

Any of the organic peroxides known in the art can be employed. Preferable examples of the organic peroxides having a 1 minute half-life temperature of 100-170° C. include dilauroyl peroxide, 1,1,3,3-tetramethyl butylperoxy 2-ethylhexanoate, dibenzoyl peroxide, t-amyl peroxy 2-ethylhexanoate, t-butylperoxy 2-ethylhexanoate, t-butylperoxy isobutyrate, t-butylperoxymaleic acid, 1,1-di(t-amylperoxy)-3,3,5-trimethylcyclohexane, 1,1-di(t-amylperoxy)cyclohexane, t-amylperoxy isononanoate, t-amylperoxy normaloctoate, 1,1-di(t-butylperoxy)-3,3,5-trimethylcyclohexane, 1,1-di(t-butylperoxy)cyclohexane, t-butylperoxyisopropylcarbonate, t-butylperoxy-2-ethylhexyl carbonate, 2,5-dimethyl-2,5-di (benzoylperoxy)hexane, t-amyl peroxybenzoate, t-butyl peroxyacetate, t-butyl peroxyisononanoate, 2,2-di(t-butylperoxy)butane, and t-butyl peroxybenzoate. Preferable examples thereof include dilauroyl peroxide, t-butylperoxyisopropyl carbonate, t-butyl peroxyacetate, t-butylperoxy isononanoate, t-butylperoxy 2-ethylhexyl carbonate, and t-butyl peroxybenzoate.

(Requirement a4))

A solar cell encapsulant of the present invention preferably has a volume resistivity, as measured in accordance with JIS K6911 at 100° C. and applied voltage of 500V, of $1.0 \times 10^{13}$-$1.0 \times 10^{18}$ Ω·cm. A solar cell encapsulant with a low volume resistivity tends to cause PID of the solar cell module. The temperature of the conventional solar cell modules during daytime when they are irradiated with sun light sometimes rises as high as 70° C., for example. Thus, in order to ensure the module's long-term reliability, volume resistivity at high temperatures (e.g., 100° C.) is more important than volume resistivity at ambient temperature (23° C.).

The volume resistivity of the solar cell encapsulant is preferably $1.0 \times 10^{14}$-$1.0 \times 10^{18}$ Ω·cm, more preferably $5.0 \times 10^{14}$-$1.0 \times 10^{18}$ Ω·cm, and most preferably $1.0 \times 10^{15}$-$1.0 \times 10^{18}$ Ω·cm. When the volume resistivity is less than $1.0 \times 10^{13}$ Ω·cm, the solar cell encapsulant tends to cause PID in a solar cell module in one day while subjecting the module to a constant temperature/humidity test at 85° C. and 85% RH. A solar cell encapsulant with a volume resistivity exceeding $1.0 \times 10^{18}$ Ω·cm tends to have static electricity and thus tends to attract dust. Thus, dust is more likely to be incorporated into the solar cell module, which leads to reduction in power generation efficiency and/or long-term reliability. On the other hand, a solar cell encapsulant having a volume resistivity exceeding $5.0 \times 10^{14}$ Ω·cm can advantageously prolong the onset of PID within the module when it is subjected to a constant temperature/humidity test at 85° C. and 85% RH.

The volume resistivity of the solar cell encapsulant is measured after the encapsulant formed into sheet is crosslinked and processed into a flat sheet in a vacuum laminator, a heat press, a crosslinking furnace or other device. Alternatively, the encapsulant layer may be taken out from the solar cell module (i.e., other layers are removed), and then the volume resistivity of the taken out encapsulant layer is measured.

(2) Second Solar Cell Encapsulant

A solar cell encapsulant according to a second embodiment of the present invention is composed of a resin composition containing (A) ethylene/α-olefin/diene copolymer, (B) a paraffinic oil, and (C) a crosslinking agent, and optionally containing various additives such as adhesion promoters.

(A) Ethylene/α-Olefin/Diene Copolymer

The ethylene/α-olefin/diene copolymer contained in the solar cell encapsulant according the second embodiment of the present invention is a copolymer which contains ethylene, an α-olefin, and a diene as the constituent units. The ethylene/α-olefin/diene copolymer may be a random copolymer or a block copolymer.

Examples of the α-olefin used for the ethylene/α-olefin/diene copolymer include propylene, 1-butene, 1-pentene, 1-hexene, 4-methyl-1-pentene, 3-methyl-1 pentene, 1-octene, 1-decene, 1-dodecene, 1-tetradecene, 1-hexadecene, 1-octadecene, and 1-eicosene, with $C_{3-10}$ α-olefin being preferable.

Examples of the diene used for the ethylene/α-olefin/diene copolymer include cyclic dienes such as 5-ethylidene-2-norbornene, 5-propylidene-5-norbornene, dicyclopentadiene, 5-vinyl-2-norbornene, 5-methylene-2-norbornene, 5-isopropylidene-2-norbornene, and norbornadiene; and chain non-conjugated dienes such as 1,4-hexadiene, 4-methyl-1,4-hexadiene, 5-methyl-1,4-hexadiene, 5-methyl-1,5-heptadiene, 6-methyl-1,5-heptadiene, 6-methyl-1,7-octadiene, and 7-methyl-1,6-octadiene. Some of the diene components may be a triene such as 2,3-diisopropylidene-5-norbornene and 4-ethylidene-8-methyl-1,7-nonadiene. In particular, 5-ethylidene-2-norbornene, dicyclopentadiene, 5-vinyl-2-norbornene and the like are preferable diene components from the perspective of moldability of a solar cell encapsulant film.

A typical example of the ethylene/α-olefin/diene copolymer is a copolymer containing ethylene as a major unit, an α-olefin as an auxialy unit, and a diene as a trace unit. Specific examples thereof include ethylene/propylene/dicyclopentadiene copolymer, ethylene/propylene/5-ethylidene-2-norbornene copolymer, ethylene/propylene/vinyl norbornene copolymer, ethylene/1-butene/dicyclopentadiene copolymer, ethylene/1-butene/5-ethylidene-2-norbornene copolymer, and ethylene/1-butene/vinyl norbornene copolymer. In particular, ethylene/propylene/diene copolymer (EPDM) is preferable.

The structural unit derived from ethylene in the ethylene/α-olefin/diene copolymer is preferably present in an amount of 50-95 mol %, more preferably 70-90 mol %, and still more preferably 80-90 mol %. When the ethylene unit content falls within the above-described ranges, it advantageously provides superior transparency and low compression permanent strain at low temperatures.

The structural unit derived from an α-olefin in the ethylene/α-olefin/diene copolymer is preferably present in an amount of 4.5-49.5 mol %, more preferably 9.5-29.5 mol %, and still more preferably 9.5-19.5 mol %. When the α-olefin unit content is too low, the ethylene/α-olefin/diene copolymer easily crystallizes and therefore flexibility and transparency of a cured material thereof tend to decrease. On the other hand, when the α-olefin unit content is too high, during the calendering process the melt is not easily released from calender rolls; therefore calenderability decreases.

The structural unit derived from a diene in the ethylene/α-olefin/diene copolymer is preferably present in an amount of 0.5-5 mol %, more preferably 0.5-2 mol %. When the diene unit content falls within the above-described ranges, it is possible attain good heat resistance and/or weather resistance.

The Mooney viscosity ML(1+4)100° C., as measured in accordance with ASTM D-1646 at 100° C., of the ethylene/α-olefin/diene copolymer contained in the solar cell encapsulant according to the second embodiment of the present invention is preferably 30-90. Mooney viscosity ML(1+4) 100° C. represents a viscosity measured at 100° C. using a large rotor with one minute preheat time and 4 minute running time of rotation of the rotor. When the Mooney viscosity ML(1+4)100° C. of the ethylene/α-olefin/diene copolymer is less than 30, the molten copolyer has a moderate viscosity and thus good moldability is easily attained even without addition of the paraffinic oil. When the Mooney viscosity ML(1+4) 100° C. of the ethylene/α-olefin/diene copolymer exceeds 90, due to high viscosity upon processing, it is difficult to improve moldability even when the paraffinic oil is added.

The crystallinity of the ethylene/α-olefin/diene copolymer is preferably low; more preferably, crystallinity measured by X-ray diffraction is 40% or less. In order to reduce the crystallinity of the ethylene/α-olefin/diene copolymer, the α-olefin content may be increased, for example. From the perspective of avoiding blocking, on the other hand, the ethylene/α-olefin/diene copolymer is preferably low crystalline rather than completely amorphous.

The melting point of the ethylene/α-olefin/diene copolymer, as measured in accordance with JIS-K7121, is preferably 70° C. or below, because such an ethylene/α-olefin/diene copolymer exhibits superior flexibility and/or transparency.

The ethylene/α-olefin/diene copolymer can be produced by copolymerizing ethylene, an α-olefin, and a diene in the presence of a vanadium-based catalyst consisting of a soluble vanadium compound and an organic aluminum hydride, or a metallocene-based catalyst consisting of a metallocene compound (e.g., a zirconium compound in which cyclopentadienyl ligands and the like are coordinated) and an organic aluminum oxy compound.

The solar cell encapsulant according to the second embodiment of the present invention may additionally contain resin(s) other than the ethylene/α-olefin/diene copolymer.

(B) Paraffinic Oil

The paraffinic oil contained in the solar cell encapsulant according to the second embodiment of the present invention is a mineral oil-based oil which contains a paraffin as the major component. Addition of the paraffinic oil to the ethylene/α-olefin/diene copolymer can enhance the moldability of the solar cell encapsulant.

The paraffin content in the paraffinic oil is preferably 55-90 wt %, more preferably 65-90 wt %. When the paraffin content is less than 55 wt %, transparency of a cured material of the solar cell encapsulant tends to decrease. On the other hand, when the paraffin content exceeds 90 wt %, a paraffinic component may precipitate. In particular, normal paraffin precipitates easily.

Among components of the paraffinic oil other than the paraffin, a naphthene component is preferably present in an amount of less than 40 wt %, more preferably less than 35 wt %. When the naphthene content is 40 wt % or more, the crosslinking efficiency of the ethylene/α-olefin/diene copolymer tends to decrease. Moreover, transparency of a cured material of the ethylene/α-olefin/diene copolymer may decrease. Although lower naphthene contents are preferable, removal of naphthenic components by extraction becomes costly.

Among components of the paraffinic oil other than the paraffin, an aromatic component is preferably present in an amount of less than 5 wt %, more preferably less than 1 wt %. When the aromatic content is 5 wt % or more, transparency of a cured material of the ethylene/α-olefin/diene copolymer tends to decrease. Moreover, the compatibility of the paraffinic oil with the ethylene/α-olefin/diene copolymer and/or the crosslinking efficiency of the ethylene/α-olefin/diene copolymer may decrease.

The paraffin content, naphthene content and aromatic content in the paraffinic oil can be measured by the n-d-M ring analysis or the method defined ASTM D-2140.

The sulfur component content in the paraffinic oil is preferably less than 200 ppm, more preferably 100 ppm. When the sulfur component content is high, the crosslinking efficiency of the ethylene/α-olefin/diene copolymer tends to decrease, and/or transparency and/or weather resistance of a cured material thereof tends to decrease (i.e., the cured material tends to be colored). The sulfur component content in the paraffinic oil is measured by the method defined in JIS K2541.

The density of the paraffinic oil as measured in accordance with JIS K2249 is preferably 859-887 kg/m$^3$. When the density falls within the above-described range, the melt viscosity of the resin composition can be easily adjusted to fall within a proper range.

The kinematic viscosity at 40° C. of the paraffinic oil as measured in accordance with JIS K2283 is preferably 30-440 mm$^2$/s. When the kinematic viscosity falls within the above-described range, the melt viscosity of the resin composition can be easily adjusted to fall within a proper range.

The pour point of the paraffinic oil as measured in accordance with JIS K2269 is preferably −25° C. to −5° C., more preferably on the order of −25° C. to −10° C. When the pour point falls within the above-described ranges, the melt viscosity of the resin composition can be easily adjusted to fall within a proper range.

Examples of the paraffinic oil include Paraffinic Process Oil PW-100, PW-32, PW-90, PW-150, PW-360, PW-380, PS-32, PS-90, PS-430 (Idemitsu Kosan Co., Ltd.); SUNPAR115, 120, 150, 2100, 2280 (Japan Sun Oil Co., Ltd.); COSMO NEUTRAL 150, 350, 500 (Cosmo Oil Lubricants Co., Ltd.); Barrel Process Oil P-46, P-56, P-150, P-380 (Matsumura Oil Co., Ltd.); JOMO Process P300, P400, P500 (JX Nippon Oil & Energy Corporation); and SHINTAC PA-100 (KOBE OIL CHEMICAL1 INDUSTRY Co., Ltd.).

The paraffinic oil content is determined in consideration of moldability, crosslinking characteristics and the like of the resin composition. More specifically, when the paraffinic oil content is too low, moldability of the molten resin composition cannot be sufficiently increased, so that the effect of improving moldability cannot be easily attained. When the paraffinic oil content is too high, the formulation has an excessively low viscosity, so that processability decreases. Further, when the paraffinic oil content is too low, the dispersibility of the crosslinking agent is reduced, and when the paraffinic oil content is too high, the crosslinking agent is diluted. Thus, in either case, crosslinking characteristics may decrease.

The paraffinic oil content is preferably set such that the MFR of a resin composition composed of the ethylene/α-olefin/diene copolymer and the paraffinic oil, as measured at 190° C. under a load of 2.16 kg, is 2-10 g/10 min, more preferably 3-10 g/10 min. When the MFR of the resin composition is less than 2 g/10 min, moldability of the resin composition is poor due to high viscosity when melted so that an ecapsulant sheet with a uniform thickness cannot be easily obtained. When the MFR of the resin composition exceeds 10 g/10 min, the resin composition easily adheres to calender rolls due to excessively low viscosity when melted.

Figure 3:
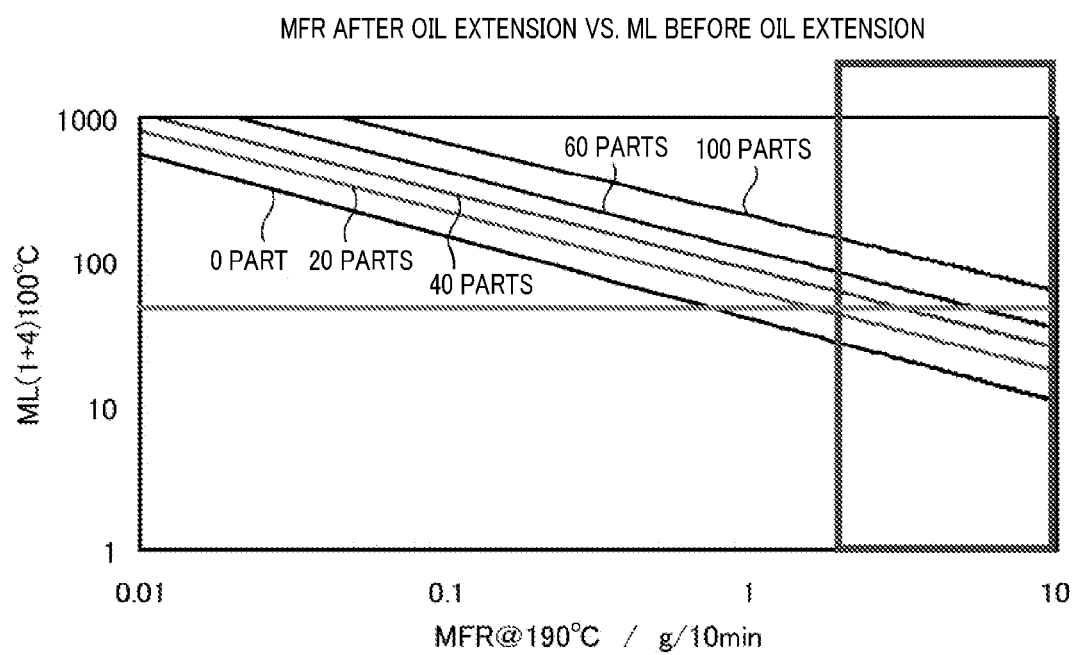
FIG. 3 is a graph of viscosity of a resin composition before oil extension vs. MFR of the oil-extended resin composition.

FIG. 3 is a graph of Mooney viscosity of a resin composition before oil extension (Y-axis) vs. MFR of the oil-extended resin composition (x-axis) for different paraffinic oil contents. As shown in FIG. 3, a paraffinic oil content that is preferable for the MFR of the oil-extended resin composition to fall within a range of 2-10 g/10 min differs depending on the Mooney viscosity ML(1+4)100° C. of the ethylene/α-olefin/diene copolymer.

For example, when the Mooney viscosity of the ethylene/α-olefin/diene copolymer is 60, in order to set the MFR of the oil-extended resin composition to 2-10 g/10 min, the paraffinic oil content may be set on the order of 20-60 parts by weight per 100 parts by weight of ethylene/α-olefin/diene copolymer, because in FIG. 3 the lines that intersect the straight line at Y=60 in the area between X=2 and X=10 are lines corresponding to 20, 40 and 60 parts by weight, respectively. Thus, a paraffinic oil content in the resin composition may be determined based on data such as that shown in FIG. 3.

(C) Crosslinking Agent

The crosslinking agent to be added to the solar cell encapsulant according to the second embodiment of the present invention may improve heat resistance and weather resistance of the encapsulant by crosslinking the polymer components in the encapsulant. It is typically preferable to employ as the crosslinking agent an organic peroxide that yields a radical upon decomposition at 100° C. or above; it is more preferable to employ an organic perxoxide having a 1 hour half-life decomposition temperature of 100-150° C., from the perspective of safety upon formulation.

Examples of organic peroxides used as the crosslinking agent include 2,5-dimethyl-2,5-di(t-butylperoxy)hexane, 3-di-t-butylperoxide, t-dicumylperoxide, 2,5-dimethyl-2,5-di(t-butylperoxy)hexyne, dicumylperoxide, α,α'-bis(t-butylperoxyisopropyl)benzene, n-butyl-4,4-bis(t-butylperoxy)butane, 2,2-bis(t-butylperoxy)butane, 1,1-bis(t-butylperoxy)cyclohexane, tertiarybutylperoxy-2-ethylhexyl carbonate, 1,1-bis(t-butylperoxy)3,3,5-trimethylcyclohexane, t-butylperoxybenzoate, 1,6-di(t-butylperoxycarbonyloxy)hexane, and benzoylperoxide. The crosslinking agent content in the solar cell encapsulant is preferably 0.01-5.0 parts by weight, more preferably 0.1-4.0 parts by weight, per 100 parts by weight of polymer components.

The Shore A hardness of the solar cell encapsulant according to the second embodiment of the present invention is preferably 80 or less. When the Shore A hardness of the solar cell encapsulant sheet exceeds 80, due to low flexibility, the encapsulant sheet easily damages solar cells when the encapsulant sheet and the solar cells are laminated together. The Shore A hardness of the solar cell encapsulant may be measured by the method defined in JIS K6301.

The internal haze of a cured material of the solar cell encapsulant according to the second embodiment of the present invention is preferably 10% or less. The total light transmittance of a 0.5 mm-thick cured material of the solar cell encapsulant is preferably 80% or more, more preferably 90% or more.

Internal haze and total light transmittance of the cured material can be measured as follows: A sample sheet (thickness: 0.5 mm) of the solar cell encapsulant of the present invention is sandwiched between a pair of clear glass, the assembly is laminated (thermal bonding) to give a sample piece, and the internal haze inside the sample piece and total light transmittance are measured with Hitachi spectrophotometer U-3010 coupled with a 150 mm-diameter integrating sphere attachment.

The above-described components (at least the ethylene/α-olefin/diene copolymer, paraffinic oil, and crosslinking agent) are mixed, kneaded and then may be molded into a sheet to form the encapsulant according to the second embodiment of the present invention.

Mixing and kneading of the components may be accomplished by simultaneously mixing and kneading the ethylene/α-olefin/diene copolymer, paraffinic oil, and crosslinking agent, or by first kneading the ethylene/α-olefin/diene copolymer and paraffinic oil followed by mixing and kneading of the crosslinking agent. Kneading means may be selected in accordance with the film formation method used; for example a mixing roll mill, a Banbury mixer, a pressure kneader, kneader-ruder, or an extruder can be employed. When kneading is effected using a mixing roll mill, the roll temperature may be set to a level which is equal to or higher than the melting point of the ethylene/α-olefin/diene copolymer and at which the components can be homogeneously kneaded.

Conventional ethylene polymer compositions cannot be processed because they cause bagging on heated calender rolls. "Bagging" refers to a phenomenon in which the kneaded melt is too viscous to wrap around a roll (i.e., to form a rolling bank). "Rolling bank" refers to a mass of molten kneaded resin created between a pair of calender rolls.

By contrast, the resin composition containing the ethylene/α-olefin/diene copolymer can be processed into a smooth sheet or film without causing "bagging" on calender rolls.

2. Optional Components in Solar Cell Encapsulant (UV Absorbers, Light Stabilizers, Thermal Stabilizers)

The ethylene resin composition constituting the solar cell encapsulant preferably contains at least one additive selected from the group consisting of a UV absorber, a light stabilizer, and a thermal stabilizer. The added amount of these additives is preferably 0.005-5 parts by weight, more preferably 0.05-5 parts by weight, per 100 parts by weight of the ethylene/α-olefin/diene copolymer.

The ethylene resin composition more preferably contains at least two kinds of additives selected from the group consisting of a UV absorber, a light stabilizer, and a thermal stabilizer, most preferably all of the three kinds of the additives. When the added amount of the three additives falls within the above-described ranges, it is advantageously possible to ensure an adequate effect of improving resistance to constant temperature/humidity, heat cycle resistance, and heat resistance stability, as well as to prevent the solar cell encapsulant from exhibiting reduced transparency and reduced adhesion to glass, backsheet, solar cells, electrodes, and aluminum.

Specific examples of the UV absorber include benzophenones such as 2-hydroxy-4-n-octyloxybenzophenone, 2-hydroxy-4-methoxybenzophenone, 2-2-dihydroxy-4-methoxybenzophenone, 2-hydroxy-4-methoxy-4-carboxybenzophenone, and 2-hydroxy-4-N-octoxybenzophenone; benzotriazoles such as 2-(2-hydroxy-3,5-di-t-butylphenyl)benzotriazole, and 2-(2-hydroxy-5-methylphenyl)benzotriazole; and salicylates such as phenylsalicylate and p-octylphenylsalicylate.

Specific examples of the light stabilizer include hindered amines and hindered piperidines, such as bis(2,2,6,6-tetramethyl-4-piperidyl)sebacate, and poly[[6-(1,1,3,3-tetramethylbutyl)amino-1,3,5-triazine 2,4-diyl][(2,2,6,6-tetramethyl-4-piperidyl)imino]hexamethylene[(2,2,6,6-tetramethyl-4-piperidyl)imino]].

Specific examples of the thermal stabilizer include phosphite thermal stabilizers such as tris(2,4-di-tert-butylphenyl)phosphite, bis[2,4-bis(1,1-dimethylethyl)-6-methylphenyl] ethyl phosphite, tetrakis(2,4-di-tert-butylphenyl)[1,1-biphenyl]-4,4'-diylbisphosphonate, and bis(2,4-di-tert-butylphenyl)pentaerythritoldiphosphite; lactone thermal stabilizers such as a reaction product of 3-hydroxy-5,7-di-tert-butyl-furan-2-one and o-xylene; hindered phenol thermal stabilizers such as 3,3',",5,5',5"-hexa-tert-butyl-a,a',a"-(methylene-2,4,6-triyl)tri-p-cresol, 1,3,5-trimethyl-2,4,6-tris(3,5-di-tert-butyl-4-hydroxyphenyl)benzylbenzene, pentaerythritoltetrakis[3-(3,5-di-tert-butyl-4-hydroxyphenyl)propionate], octadecyl-3-(3,5-di-tert-butyl-4-hydroxyphenyl)propionate, and thiodiethylenebis[3-(3,5-di-tert-butyl-4-hydroxyphenyl)propionate]; sulfur thermal stabilizers; and amine thermal stabilizers. These thermal stabilizers can be used singly or in combination. In particular, phosphite thermal stabilizers and hindered phenol thermal stabilizers are preferable.

(Additional Additives)

The ethylene resin composition that constitutes the solar cell encapsulant may contain additional component(s) as appropriate without compromising the object of the present invention. Examples thereof include polyolefins other than ethylene/α-olefin/non-conjugated polyene copolymers, styrene or ethylene block copolymers, and propylene polymers. The additional components may be present in an amount of 0.0001-50 parts by weight, preferably 0.001-40 parts by weight, per 100 parts by weight of the ethylene/α-olefin/non-conjugated polyene copolymer. The ethylene resin composition that constitutes the solar cell encapsulant may contain one or more additives selected from resins other than polyolefins and/or rubbers, plasticizers, fillers, pigments, dyes, antistatic agents, antimicrobial agents, antibacterial agents, flame retardants, crosslinking aids, and dispersants.

In particular, a crosslinking aid is added to the ethylene resin composition in an amount of 0.05-5 parts by weight, and preferably 0.2-4.0 parts by weight, per 100 parts by weight of the ethylene/α-olefin/non-conjugated polyene copolymer. When the ethylene resin composition contains a crosslinking aid in an amount that falls within the above-described ranges, the ethylene resin composition has moderate crosslinked structure and thus advantageously exhibits improved heat resistance, mechanical properties and adhesion.

The crosslinking aid refers to any crosslinking aid which is known in the art and is commonly used for olefin resins. The crosslinking aid has a double bond in its molecule. Specific examples thereof include monoacrylates such as t-butyl acrylate, laurylacrylate, cetyl acrylate, stearylacrylate, 2-methoxyethyl acrylate, ethylcarbitol acrylate, methoxytripropylene glycol acrylate; monomethacrylates such as t-butyl methacrylate, lauryl methacrylate, cetyl methacrylate, stearyl methacrylate, methoxyethylene glycol methacrylate, and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, and polypropylene glycol diacrylate; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate, and polyethylene glycol dimethacrylate; triacrylates such as trimethylolpropane triacrylate, tetramethylolmethane triacrylate, and pentaerythritol triacrylate; trimethacrylates such as trimethylolpropane trimethacrylate, and trimethylolethane trimethacrylate; tetraacrylates such as pentaerythritol tetraacrylate and tetramethylolmethane tetraacrylate; divinyl aromatic compounds such as divinylbenzene and di-1-propenylbenzene; cyanurates such as triallylcyanurate and triallylisocyanurate; diallyl compounds such as diallyl phthalate; triallyl compounds; oximes such as p-quinonedioxime and p-p'-dibenzoyl quinonedioxime; maleimides such as m-phenylmaleimide; and 1,2-polybutadiene. In particular, diacrylates; dimethacrylates; divinyl aromatic compounds; triacrylates such as trimethylolpropane triacrylate, tetramethylolmethane triacrylate, and pentaerythritol triacrylate; trimethacrylates such as trimethylolpropane trimethacrylate, and trimethylolethane trimethacrylate; tetraacrylates such as pentaerythritol tetraacrylate and tetramethylolmethane tetraacrylate; cyanurates such as triallylcyanurate and triallylisocyanurate; diallyl compounds such as diallyl phthalate; triallyl compounds; oximes such as p-quinonedioxime and p-p'-dibenzoyl quinonedioxime; maleimides such as m-phenylmaleimide; and 1,2-polybutadiene are more preferable, with triallylisocyanurate being particularly preferable. These crosslinking aids reduce the generation of gas in the solar cell encapsulant after lamination and thereby moderately improve crosslinking characteristics.

When the ethylene resin composition for the solar cell encapsulant is cured in a curelastometer at 150° C. and 100 cpm, the time to achieve 90% of the maximum torque (Tc90) is preferably 8-14 minutes, more preferably 8-13 minutes, and still more preferably 9-12 minutes. When Tc is shorter than 8 minutes, gelation may occur when the solar cell encapsulant is calendered into sheet using a calendering machine resulting in the formation of irregularity on the surface of the sheet due to the presence of gel-like matter and therefore sheet appearance may be deteriorated. Application of voltage to the sheet causes cracking around the gel-like matter and therefore dielectric breakdown strength decreases. Moisture permeation easily occurs at the interface of the gel-like matter and therefore moisture permeation resistance decreases. The irregularity generated on the sheet surface reduces contact with glass, solar cells, electrodes, and backsheet during the solar cell module lamination process, resulting in insufficient adhesion. When Tc90 exceeds 14 minutes, the time required for crosslinking during the solar cell module lamination process tends to be prolonged, and therefore the manufacture of a solar cell module becomes lengthy.

When the ethylene resin composition to be contained in the solar cell encapsulant is kneaded at 120° C. and 30 rpm in the micro rheology compounder, the time required for a torque to rise to 0.1 Nm from a minimum value is preferably 10-100 minutes, more preferably 10-90 minutes, and still more preferably 10-80 minutes. When the above-described time is shorter than 10 minutes, gelation may occur when the solar cell encapsulant is calendered into sheet with a calender machine, resulting in the formation of irregularity on the surface of the sheet due to the presence of gel-like matter and therefore sheet appearance may be deteriorated. Application of voltage to the sheet causes cracking around the gel-like matter and therefore dielectric breakdown strength decreases. Moisture permeation easily occurs at the interface of the gel-like matter and therefore sheet moisture permeation resistance decreases. The irregularity generated on the sheet surface reduces contact with glass, solar cells, electrodes, and backsheet during the solar cell module lamination process, resulting in insufficient adhesion. When the above-described time exceeds 100 minutes, the degree of crosslinking of resin during the solar cell module lamination process may be insufficient, which may reduce heat resistance and/or adhesion to glass.

3. Characteristics and Production Process of Solar Cell Encapsulation Material The solar cell encapsulant of the present invention has a superior balance among adhesion to various module components, transparency, flexibility, heat resistance, calenderability, and crosslinking characteristics. Examples of the module components include glass substrate, backsheet, thin-film electrode, aluminum frame, and solar cells. The solar cell encapsulant of the present invention is also superior in weather resistance, volume resistivity, electric insulation, moisture permeation resistance, electrode corrosion resistance, and process stability, lending itself to be suitably used in a solar cell module. The solar cell encapsulant of the present invention may be produced by melt-blending the above-described components using a common machine such as a kneader, a Banbury mixer, an extruder, or a calender machine, but preferably using a calender machine.

One of the preferred embodiments is a solar cell encapsulant that is in sheet form entirely. Moreover, the solar cell encapsulant may be a laminate consisting of a plurality of layers, at least one of which is composed of the above-described ethylene resin composition.

The thickness of the solar cell encapsulant sheet is typically 0.01-2 mm, preferably 0.05-1.5 mm, more preferably 0.1-1.2 mm, still more preferably 0.2-1 mm, further still more preferably 0.3-0.9 mm, and most preferably 0.3-0.8 mm. When a solar cell encapsulant sheet having a thickness that falls within the above-described ranges is laminated in the solar cell module lamination process, the sheet is less likely to damage glass, solar cells, thin-film electrodes and other module components, as well as ensures sufficient light transmittance so that photovoltaic power of the solar cells can be increased. Further, a solar cell module lamination process can be carried out at low temperatures.

There are no particular limitations on the molding method for a solar cell encapsulant sheet, and any of the various molding methods known in the art can be employed; examples thereof include cast molding, extrusion sheet molding, inflation molding, injection molding, compression molding, and calender molding. In particular, it is preferable to mold the solar cell encapsulant sheet using a calender machine, where the molten resin is rolled with heated metal rolls (calender rolls) into sheet of desired thickness.

It is preferable that the ethylene/α-olefin/diene copolymer, ethylenically-unsaturated silane compound, organic peroxide, UV absorber, light stabilizer, thermal stabilizer and optional additive(s) be melt-kneaded and calendered into sheet to form a solar cell encapsulant sheet. Any of the calender machines known in the art may be employed; for example, a mixing roll mill, a three roll calender, or a four roll calender can be employed. The four roll calender may include calender rolls arranged in I form, S form, inverted L form, Z form, slanted Z form, or the like.

Prior to the calendering process, it is also preferable to heat the ethylene resin composition to a moderate temperature. For example, it is also preferable to install for example a mixing roll mill, a Banbury mixer, a (pressure) kneader, kneader-ruder, or an extruder. The calender roll temperature for the calendering process is typically 40-100° C. When the roll temperature is set below 40° C., the molten ethylene resin composition in the rolling bank cannot be easily fed between the calender rolls at the calender nip, and therefore the productivity of solar cell encapsulant decreases. On the other hand, when the roll temperature is set above 100° C., gelation may occur when the solar cell encapsulant is calendered into sheet with a calender machine, resulting in the formation of irregularity on the surface of the sheet due to the presence of gel-like matter and therefore sheet appearance may be deteriorated. Application of voltage to the sheet causes cracking around the gel-like matter and therefore dielectric breakdown strength decreases. Moisture permeation easily occurs at the interface of the gel-like matter and therefore moisture permeation resistance decreases. The irregularity generated on the sheet surface reduces contact with glass, solar cells, electrodes, and backsheet during the solar cell module lamination process, resulting in insufficient adhesion.

The solar cell encapsulant sheet may be embossed on its surface. By embossing the encapsulant surface, possible blocking between the encapsulant sheets or between the encapsulant sheet and other sheets may be prevented. Moreover, since embossing reduces the storage modulus of the solar cell encapsulant, the formed relief acts as a cushion for solar cells and other module components during the lamination process and thus can avoid breakage of the solar cells.

The porosity (P) of a solar cell encapsulant sheet, defined as the percentage ratio ($V_H/V_A \times 100$) of the total volume ($V_H$) of the recessed relief per unit area of the encapsulant sheet to its apparent volume ($V_A$) is preferably 10-50%, more preferably 10-40%, and still more preferably 15-40%. The apparent volume ($V_A$) of the solar cell encapsulant sheet is found by multiplying unit area by maximum thickness of the solar cell encapsulant sheet. When porosity P is less than 10%, it results in failure to sufficiently reduce the modulus of elasticity of the solar cell encapsulant and to provide sufficient cushion.

When porosity P of the solar cell encapsulant sheet is less than 10%, even when pressure is applied to part of the embossed solar cell encapsulant, the pressed raised relief fails to deform. Thus, during the solar cell module lamination process, some of the crystalline solar cells receive large pressure causing cracking in the cells. When the module layers are laminated together in the second stage (pressing step) during module manufacture, in the case of silicon solar cells, the crystalline solar cells themselves or solder used to fix the solar cells to the electrode break, and in the case of thin-film solar cells, the silver electrode breaks. Moreover, when porosity P of the solar cell encapsulant sheet is less than 10%, there is less space for air to travel through, resulting in degassing failure during the lamination process. Thus the air trapped in the solar cell module layers may deteriorate the appearance and/or during long-term usage the moisture in the air may corrode electrodes and other module components. During the lamination process the molten ethylene resin composition fails to flow and fill the space and therefore the excessive ethylene resin composition may squeeze out of the solar cell module layers and contaminate the laminator.

On the other hand, when porosity P of the solar cell encapsulant sheet is greater than 80%, it becomes likely that air cannot be completely removed during the pressing step in the lamination process resulting the air being more prone to remain trapped within the module. The air trapped in the solar cell module may deteriorate the appearance of the solar cell module and/or during long-term usage the moisture in the air may corrode electrodes and other components. Failure to completely remove air during the pressing step in the lamination process also reduces the contact area between the solar cell encapsulant and module layers, leading to poor adhesion.

Porosity P can be found through the following calculation. The apparent volume $V_A$ (mm$^3$) of the embossed solar cell encapsulant is found by multiplying maximum thickness $t_{max}$ (mm) of the encapsulant by unit area (e.g., 1 mm$^2$=1,000×1,000=10$^6$ mm$^2$) as follows:

$$V_A(\text{mm}^3) = t_{max}(\text{mm}) \times 10^6 (\text{mm}^2) \quad (3)$$

On the other hand, the actual volume $V_0$ (mm$^3$) of the solar cell encapsulant for the unit area is calculated by substituting ρ (specific gravity (g/mm$^3$) of resin constituting the encapsulant) and W (actual weight (g) of the encapsulant per unit area (1 m$^2$) into the following equation (4):

$$V_0(\text{mm}^3) = W/\rho \quad (4)$$

The total volume $V_H$(mm$^3$) of the recessed relief per unit area of the encapsulant is found by subtracting "actual volume $V_0$ from "apparent volume $V_A$" as shown in the following equation (5):

$$V_H(\text{mm}^3) = V_A - V_0 = V_A - (W/\rho) \quad (5)$$

Porosity (%) can thus be found using the following equation:

$$\begin{aligned}\text{Porosity } P(\%) &= V_H / V_A \times 100 \\ &= (V_A - (W/\rho))/V_A \times 100 \\ &= 1 - W/(\rho \cdot V_A) \times 100 \\ &= 1 - W/(\rho \cdot t_{max} \cdot 10^6) \times 100\end{aligned}$$

Porosity P can be measured for example by microscopic observation and subsequent image processing of a cross section or embossed surface of the solar cell encapsulant.

The depth of the recessed relief is preferably 20-95% of the maximum thickness of the solar cell encapsulant, more preferably 50-95%, and still more preferably 65-95%. The percentage ratio of the depth of the recessed relief to the maximum sheet thickness ($t_{max}$) may be referred to as the "depth ratio" of the recessed relief. The depth of the recessed relief refers to height difference D between the top of the raised relief and the bottom of the recessed relief on the embossed surface of the solar cell encapsulant. Maximum thickness $t_{max}$ of solar cell encapsulant refers to the distance from the top of the raised relief on the embossed surface to the other side (in the thickness direction of the encapsulant) in the case where the encapsulant is embossed on one side, and refers to the distance from the top of the raised relief on one side to the top of the raised relief on the other side (in the thickness direction of the encapsulant) in the case where the encapsulant is embossed on both sides.

Embossing may be performed on one or both sides of the solar cell encapsulant. When deepening the recessed relief, embossing is preferably performed only on one side of the encapsulant. When the encapsulant is embossed only on one side, $t_{max}$ is 0.01-2 mm, preferably 0.05-1 mm, more preferably 0.1-1 mm, still more preferably 0.15-1 mm, yet more preferably 0.2-1 mm, still yet more preferably 0.2-0.9 mm, yet still more preferably 0.3-0.9 mm, and most preferably 0.3-0.8 mm. When $t_{max}$ is within the above-described ranges, not only possible breakage of module components such as glass, solar cells, and thin-film electrodes can be avoided, but the solar cell module lamination can be carried out at relatively low temperatures. Such a solar cell encapsulant has sufficient light transmittance and enhances photovoltaic power of the solar cell module.

The solar cell encapsulant sheet may be sheet form in such a size to fit the solar cell module or be roll form ready for cutting into a sheet with such a size to fit the solar cell module.

The solar cell encapsulant sheet, which is a preferred embodiment of the present invention, only needs to have at least layer formed of the above-described ethylene resin composition. The solar cell encapsulant sheet may have either one or more of the layers formed of the above-described ethylene resin composition. However, it is preferable to form a single layered solar cell encapsulant sheet formed of the above-mentioned ethylene resin composition, from the perspective of low production costs and reducing the reflection of light at the layer-to-layer interface for efficient utilization of light.

The solar cell encapsulant sheet may consist of the above-mentioned ethylene resin composition or may include an additional layer other than the layer formed of the ethylene resin composition. Examples of the additional layer include hardcoat layers for protecting front or back sides, adhesion layers, antireflection layers, gas barrier layers, and antifouling layers. Additional examples thereof include UV curable resin layers, thermosetting resin layers, polyolefin resin layers, carboxylic acid-modified polyolefin resin layers, fluorine resin layers, cyclic olefin (co)polymer layers, and inorganic compound layers.

There are no particular limitations on the positional relationship between the layer formed of the ethylene resin composition and the additional layer; a preferred layer configuration is appropriately selected according to the object of the present invention to be achieved. The additional layer may be sandwiched by two or more layers formed of the ethylene resin composition, may be provided as the outermost layer of the solar cell encapsulant, or may be provided at places other than the foregoing. The additional layer may be provided only on one side or both sides of the solar cell encapsulant. Any number of the additional layer may be provided; the additional may not be provided.

There are no particular limitations on the lamination method in which to laminate the layer made of the ethylene resin composition and the additional layer. It is preferable to employ a method in which a laminate is obtained by co-extrusion using a known melt extruder such as a cast molding machine, an extrusion sheet molding machine, an inflation molding, an injection molding machine or the like, or a method in which one of the two layers previously formed is laminated to the other one by melting or heating. The lamination may be effected through a dry lamination process or a heat lamination process in which a suitable adhesive is used. Examples of the adhesive include maleic anhydride-modified polyolefin resins such as "ADMER" (Mitsui Chemicals, Inc.) and "MODIC" (Mitsubishi Chemicals, Inc.); low (non)crystalline elastic polymers such as unsaturated polyolefins; acrylic adhesives represented by a terpolymer of ethylene, acrylate, and maleic anhydride (e.g., "BONDINE" Sumica CDF); ethylene/vinyl acetate copolymers; and adhesive resin compositions containing the ethylene/vinyl acetate copolymer). The adhesive preferably has a heat resistance at about 120-150° C.; for example, polyester or polyurethane adhesives may be suitably used. For improved adhesion, the adhesion layer surface may be subjected to silane coupling treatment, titanium coupling treatment, corona treatment, and/or plasma treatment.

4. Solar Cell Module

A crystalline solar cell module, one form of a solar cell module, typically includes solar cells, solar cell encapsulant layers sandwiching the cells, and protection sheets covering both sides of the module. Specifically, a typical construction of a solar cell module is as follows: module protection sheet (front protection member)/encapsulant layer/solar cells/encapsulant layer/module protection sheet (back protection member). It should be noted that the construction of the solar cell module of the present invention is not limited to this typical construction; where appropriate, some of the layers may be deleted and/or additional layer(s) may be added without compromising the object of the present invention. Examples of the additional layer include adhesion layers, shock absorbing layers, coating layers, antireflection layers, back re-reflection layers, and light diffusion layers. These layers can be provided in place in any desired location according to the intended purpose and their characteristics.

There is a possibility that a solar cell module containing solar cells, crystalline power generation elements, experiences potential induced degradation (PID). The solar cell encapsulant of the present invention has an effect of reducing the occurrence of PID and is therefore suitably applicable to a solar cell module containing solar cells or crystalline power generation elements.

(Crystalline Silicon Solar Cell Module)

FIG. 1 illustrates an example of the construction of a crystalline silicon solar cell module. As illustrated in FIG. 1, solar cell module 20 includes a plurality of crystalline silicon solar cells 22 electrically interconnected via interconnectors 29, a pair of front protection member 24 and back protection member 26 which sandwiches solar cells 22, and encapsulant layer 28 which fills a space between the protection members and solar cells 22. Encapsulation layer 28 contacts electrodes respectively formed on the light-incident surface and back surface of each solar cell 22. The electrodes are current collectors respectively formed on the light-incident side and back side of each solar cell 22, and each includes collector lines, tab-type busbars, back electrode layer and the like, which will be later described. Encapsulation layer 28 is produced by bonding together the solar cell encapsulant sheets and pressing the bonded sheets under heating.

Figure 2A:
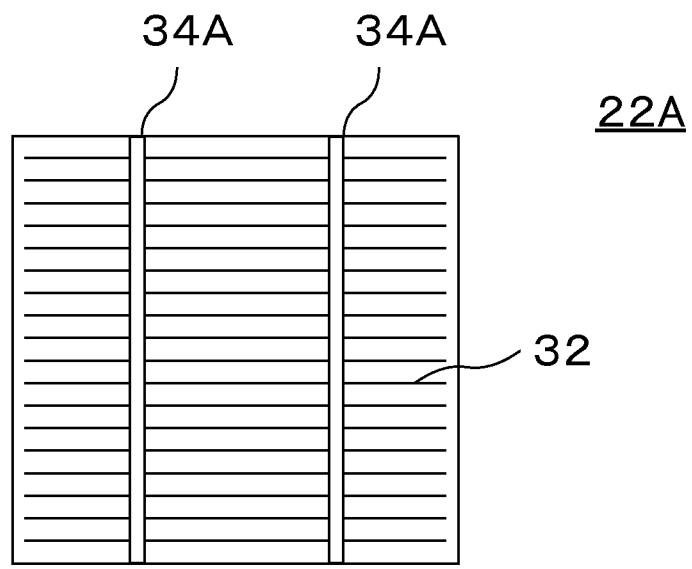
FIGS. 2A and 2B are plan views schematically illustrating an example of the construction of a light-incident side or back side of a solar cell.
Figure 2B:
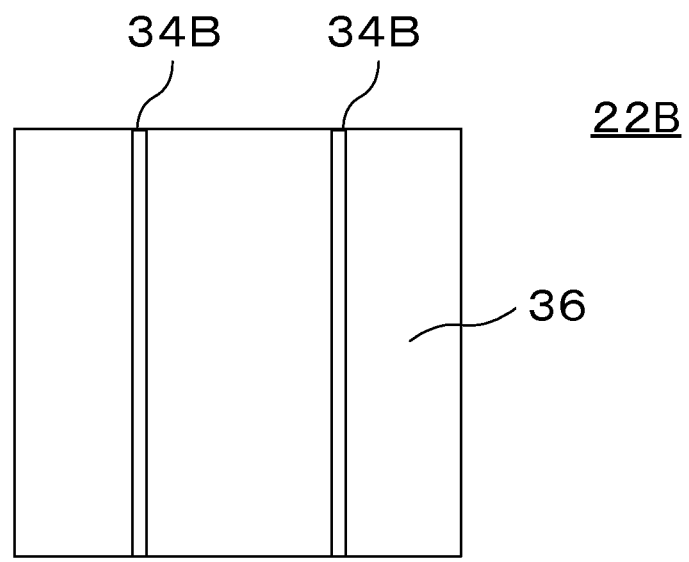

FIGS. 2A and 2B illustrate an example of a configuration of light-incident surface 22A or back surface 22B of solar cell 22. As illustrated in FIG. 2A, solar cell 22 includes on light-incident surface 22A multiple rows of collector lines 32 and tab-type busbars 34A that are connected to interconnectors 29 and to collector lines 32. As illustrated in FIG. 2B, solar cell 22 includes conductive layer (back electrode) 36 formed on back surface 22B, and tab-type busbars 34B are formed thereon that are connected to interconnectors 29. The line width of collector lines 32 is, for example, about 0.1 mm, the line width of tab-type busbars 34A is, for example, about 2-3 mm, and the line width of tab-type busbars 34B is, for example, about 5-7 mm. The thickness of collector lines 32, tab-type busbars 34A and tab-type busbars 34B is, for example, about 20-50 μm.

Collector lines 32, tab-type busbars 34A and tab-type busbars 34B preferably contain a metal with high conductivity.

Examples of metals with high conductivity include gold, silver and copper, with silver, silver compounds and silver-containing alloys being preferable from the perspective of their high conductivity and high corrosion resistance. Conductive layer 36 preferably contains not only a metal with high conductivity, but also a component with high light reflectivity, such as aluminum, for reflecting light received at the light-incident surface to enhance the opto-electronic conversion efficiency. Collector lines 32, tab-type busbars 34A, tab-type busbars 34B and conductive layer 36 are formed by depositing a conductive material solution containing the conductive metal onto either light-incident surface 22A or back surface 22B of solar cell by, for example, screen printing to a thickness of 50 μm, drying the deposited coating and, where necessary, firing the coating at 600-700° C.

Front protection member 24 needs to be transparent as it is placed on the light-incident surface side. Examples of front protection member 24 include transparent glass plates and transparent resin films.

Back protection member 26, on the other hand, needs not to be transparent, and the material thereof is not particularly limited. Examples of back protection member 26 include glass substrates and plastic films, with glass substrates being suitable from the perspective of high resistance and transparency.

Solar cell module 20 can be manufactured by any method. For example, solar cell module 20 can be obtained by the method including the steps of: obtaining an assembly in which module components are laminated in the order of back protection member 26, solar cell encapsulant sheet, solar cells 22, solar cell encapsulant sheet, and front protection member 24; pressing the assembly with a laminator or the like simultaneously with optional heating; and optionally heating the assembly to cure the encapsulant.

(2) Thin-Film Silicon (Amorphous Silicon) Solar Cell Module

Thin-film amorphous solar cells may be manufactured by forming a thin film of amorphous silicon of several micrometers thickness onto a glass or film substrate by chemical vapor deposition (CVD) using silane gas, and depositing thereon an electrode (e.g., Ag electrode) by sputtering. A thin-film silicon solar cell module may then be manufactured by laminating, in order, the thin-film silicon solar cells, the solar cell encapsulant sheet, and protection sheet for solar cell modules (back protection member).

A thin-film silicon solar cell module may be configured as: (1) a laminate in which module components are laminated in the order of transparent front protection member (glass substrate), thin-film solar cells, encapsulant layer, and back protection member; (2) a laminate in which module components are laminate in the order of transparent front protection layer, encapsulant layer, thin-film solar cells, encapsulant layer, and back protection layer; or the like. The transparent front protection member, back protection member and encapsulating layer are identical to those for the crystalline silicon solar cell module described above.

A thin-film silicon solar cell of a thin-film silicon solar cell module with configuration (1) includes, in order, a transparent electrode layer, a silicon p-i-n layer, and a back electrode layer, for example. Examples of materials of the transparent electrode layer include semiconductor oxides, such as $In_2O_3$, $SnO_2$, ZnO, $Cd_2SnO_4$, and ITO ($In_2O_3$ doped with Sn). The back electrode layer includes a silver thin film layer, for example. Each layer is formed by plasma chemical vapor deposition (CVD) or sputtering. The encapsulant layer is placed so as to contact the back electrode layer (e.g., silver thin film layer). Since the transparent electrode layer is formed on the transparent front protection member, it is often the case that the encapsulant layer is not disposed between the front protection member and transparent electrode layer.

A thin-film silicon solar cell of a thin-film solar cell module with configuration (2) includes, in order, a transparent electrode layer, a silicon p-i-n layer, and a metal foil or thin metal layer (e.g., silver thin film layer) formed on a heat-resistant polymer film, for example. Examples of the metal foil include stainless steel foil. Examples of the heat-resistant polymer film include polyimide films. The transparent electrode layer and silicon p-i-n layers are formed by CVD or sputtering as with those described above. That is, the silicon p-i-n layer is formed on the metal foil or the thin metal layer formed on the heat-resistant polymer film, and the transparent electrode layer is formed on the silicon p-i-n layer. The thin metal layer formed on the heat-resistant polymer film may also be formed by CVD or sputtering.

In this case, the encapsulant layer is placed between the transparent electrode layer and the front protection member, and between the metal foil or heat-resistant polymer film and the back protection member. In this manner the encapsulating layer obtained from the solar cell encapsulant contacts the electrodes of solar cells, such as collector lines, tab-type busbars, and conductive layer. Thin-film silicon solar cells of a crystalline silicon solar cell module with configuration 1) have silicon layers that are thinner than those in crystalline silicon solar cells of a crystalline silicon solar cell module and thus are less prone to breakage by the pressure applied during the manufacture of the solar cell module or by external impact during operation. Thus, solar cell encapsulants for the thin-film silicon solar cell module may have inferior flexibility to those for the crystalline silicon solar cell module. On the other hand, when the electrodes of thin-film solar cells are degraded by corrosion, there is fear that power generation efficiency significantly decreases. The solar cell encapsulant of the present invention formed of the ethylene resin composition sometimes exhibits inferior flexibility to ethylene/vinyl acetate (EVA) copolymer, but does not necessarily require a crosslinking agent, a source of cracked gas. Thus, the solar cell encapsulant of the present invention is used more suitably as a solar cell encapsulant for thin film solar cell modules.

A solar cell typically includes a collecting electrode for collecting electricity generated. Examples of the collecting electrode include a bus bar electrode and a finger electrode. Typically, the collecting electrode is disposed on both (front and back) sides of a solar cell. However, when the collecting electrode is disposed on the light-incident surface, the collecting electrode blocks light and thus power generation efficiency undesirably may decrease.

Recently, for improved power generation efficiency, back-contact solar cells have been studied that eliminate the need to provide a collecting electrode on the light-incident surface. In one form of the back-contact solar cell, a P-doped region and an N-doped region are alternately provided on the back side of the solar cell opposite to the light-incident side. In another form of the back-contact solar cell, a p/n junction is formed in a substrate in which a through hole is bored, and a doped layer for the front side (light-incident side) is formed that extends from the inner surface of the through hole to the vicinity of the through hole on the back side, so that current of the light-incident side is taken out at the front side.

In a solar cell system, generally, several to several tens of solar cell modules are connected in series. The system voltage of small-scale solar cell systems for residential use is set to 50-500V, and for large-scale solar cell systems called mega solar power plant it is set to 600-1,000 W. A solar cell module is often framed with an aluminum frame in order, for example, to ensure strength, and the aluminum frame is often grounded from the perspective of safety. As a consequence, when the solar cells generate electricity, a potential difference occurs between the glass substrate (protection member) and the solar cell. Thus, the encapsulant layer positioned between the solar cell and glass substrate or between the solar cell and aluminum frame is required to have good electrical characteristics such as high electrical insulation and/or high resistance.

The encapsulant layer positioned on the back side of the solar cells of the module is required to have adhesion to the encapsulant layer on the front side of the solar cells, electrodes, or back protection layer. The encapsulant layer is also required to have thermoplasticity in order to keep smooth the back side of the solar cells. Moreover, the encapsulant layer is required to be superior in scratch resistance, impact absorbance and the like in order to protect the solar cells.

The encapsulant layer positioned on the back side of the solar cells is not required to be transparent unlike the encapsulation layer positioned on the front side of the solar cells. The solar cell encapsulant of the present invention is advantageously used as an encapsulant layer on the back side of the solar cells, particularly as an encapsulant layer on the back side of a crystalline solar cell module or an encapsulant layer on the back side of a thin-film solar cell module, which is susceptible to water permeation.

The encapsulant layer in the solar cell module desirably has heat resistance. For example, it is desirable that the ethylene resin composition constituting the solar cell module do not undergo degeneration, degradation and decomposition by the heat during the solar cell module lamination and/or the heat of sunlight during the long-term operation of the module. When the additives and other components contained in the ethylene resin composition elute and/or when decomposed matter is generated, they act on the electromotive surface of the solar cells (cell surface) and deteriorate their function and/or performance. Accordingly, heat resistance is an essential property for the encapsulant layer of solar cell modules. Further, the encapsulant layer is preferably superior in moisture resistance. With moisture resistance it is possible to prevent penetration of moisture from the back side of the solar cell module preventing corrosion and/or degradation of the solar cells of the module.

(Surface Protection Member in Solar Cell Module)

There are no particular limitations on the front protection member used in a solar cell module. However, since the front protection member is placed as the outermost layer of a solar cell module, it preferably has such properties that allow for long-term outdoor exposure, including weather resistance, water repellency, contamination resistance, and mechanical strength. The front protection member is preferably a sheet with less optical loss and high transparency for efficient utilization of sunlight.

Examples of front protection members used for the solar cell module include resin films made of polyester, fluorine resin, acrylic resin, cyclic olefin (co)polymer, ethylene/vinyl acetate copolymer or the like, and glass substrates. Preferable resin films include films made of polyester resins, which are superior in transparency, strength, costs, etc., particularly films made of polyethylene terephthalate resins and films made of fluorine resin which have good weather resistance. Examples of fluorine resins include ethylene/tetrafluoroethylene copolymers (ETFE), polyvinyl fluoride resins (PVF), polyvinylidene fluoride resins (PVDF), polytetrafluoroethylene resins (TFE), tetrafluoroethylene/hexafluoride propylene copolymers (FEP), and polyethylene chloride trifluoride resins (CTFE). Polyvinylidene fluoride resins are superior in terms of weather resistance, but tetrafluoroethylene/hexafluoride propylene copolymers are more superior in terms of achieving both weather resistance and mechanical strength. In order to improve adhesion to other layers such as the encapsulant layer, the front protection layer is preferably subjected corona treatment and/or plasma treatment, for example. Moreover, it is possible to employ a sheet stretched for improved mechanical strength, such as a biaxially oriented polypropylene sheet.

When a glass substrate is employed as the surface protection member in a solar cell module, a glass substrate is employed that has total light transmittance of 80% or more, preferably 90% or more, in the wavelength range of 350-1, 400 nm. In general, clear glass, which has less absorption in the infrared region, is generally used; however, soda lime glass may be employed. Soda lime glass with a thickness of 3 mm or less is less likely to deteriorate output characteristics of the module. Moreover, although reinforced glass can be employed as the glass substrate subjected to thermal treatment for improved mechanical strength, a float glass substrate not subjected to thermal treatment may be employed. In order to reduce light reflection, the glass substrate may also be provided with antireflective coating on the light-incident surface.

(Back Protection Member in Solar Cell Module)

There are no particular limitations on the back protection member used in a solar cell module. However, since the member is located as the outermost layer of a solar cell module, weather resistance, mechanical strength and other properties are required. Thus, the back protection member may be formed of the same material as the front protection member. Namely, the above materials usable for the front protection member can be used for the back protection member. In particular, polyester resins and glass can be used suitably.

Since the back protection member is not designed to allow sunlight to pass therethrough, transparency is not necessarily required, Thus, in order to increases the mechanical strength or prevent deformation or warpage of the solar cell module, a reinforcement plate may be attached. A preferable reinforcement plate is, for example, a steel plate, a plastic plate, a glass fiber reinforced plastic (FRP) plate or the like.

The encapsulant of the present invention may be integrated with the back protection member. The encapsulant integrated with the back protection member can simplify the module assembling process. For example, it is possible to eliminate the cutting process in which the encapsulant and back protection member are cut into the solar cell module size. Moreover, it is possible to shorten or eliminate the lay-up process in which the encapsulant and back protection member are laid.

Integration of the solar cell encapsulant with the back protection member may be accomplished by laminating the encapsulant with the back protection member. There are no particular limitations on the method of lamination; preferable lamination methods include a method in which materials of the encapsulant and back protection member are co-extruded with a known melt-extruder such as a cast molding machine, an extrusion sheet molding machine, an inflation molding machine, or an injection molding machine, and a method in which one of the layers is melt- or heat-laminated onto the other layer previously molded.

The lamination may be effected through a dry lamination process or a heat lamination process in which a suitable adhesive is used. Examples of the adhesive include maleic anhydride-modified polyolefin resins such as "ADMER" (Mitsui Chemicals, Inc.) and "MODIC" (Mitsubishi Chemicals, Inc.); low (non)crystalline elastic polymers such as unsaturated polyolefins; acrylic adhesives represented by a terpolymer of ethylene, acrylate, and maleic anhydride (e.g., "BONDINE" (Sumica CDF)); ethylene/vinyl acetate copolymers; and adhesive resin compositions containing the ethylene/vinyl acetate copolymer). The adhesive preferably has a heat resistance at about 120-150° C.; for example, polyester or polyurethane adhesives may be suitably used. For improved adhesion, at least one side of the member to be coated with the adhesion may be subjected to silane coupling treatment, titanium coupling treatment, corona treatment, and/or plasma treatment.

(Solar Cell)

There are no particular limitations on the solar cells used in the solar cell module as long as they can generate electricity by photovoltaic effect of semiconductor. Examples of the solar cells include silicon (monocrystalline, polycrystalline or amorphous) solar cells, compound semiconductor (III-III Group, II-VI Group, etc.) solar cells, dye-sensitized solar cells, and organic semiconductor solar cells. In particular, polycrystalline silicon solar cells are preferable in view of, for example, the balance between power generation performance and production costs.

Examples of silicon-based solar cell include a hybrid-type (HIT) solar cell in which crystalline silicon and amorphous silicon are laminated; a multijunction (tandem) solar cell in which silicon layers with different absorption wavelength ranges are laminated; and a spherical silicon solar cell in which a countless number of spherical silicon particles (about 1 mm in diameter) and a concave mirror (also serves as an electrode) of 2-3 mm diameter are combined.

Other examples of the silicon-based solar cell include field-effect solar cells in which the role of the conventional amorphous silicon p-type window layer with p-i-n junction is changed from "insulated transparent electrode" to "inversion layer induced by electric field effect."

Examples of the solar cell also include a GaAs solar cell in which monocrystalline GaAs is used; a CIS or CIGS (chalcopyrite) solar cell in which a I-III-VI compound called a chalcopyrite compound formed of Cu, In, Ga, Al, Se, S and/or the like is used instead of silicon; a CdTe—CdS solar cell in which a thin film of Cd compound is used; and a $Cu_2ZnSnS_4$ (CZTS) solar cell. The solar cell encapsulant of the present invention can be used as a solar cell encapsulant for solar cell modules containing all of the types of the above-described solar cells.

Silicon solar cells as well as compound semiconductor solar cells have superior solar cell characteristics, but are known to be susceptible to breakage by external stress or impact. An encapsulant sheet produced from the solar cell encapsulant of the present invention exhibits superior flexibility and thus can avoid possible breakage of solar cells by absorbing stress or impact to the solar cells. It is therefore preferable that the encapsulant sheet formed of the solar cell encapsulant of the present invention be directly bound to the solar cells within the module. Moreover, when the encapsulant layer has thermoplasticity, the solar cells can be relatively readily removed the module improving the recycling efficiency of solar cells. Since the encapsulant layer formed of the solar cell encapsulant of the present invention has thermoplasticity, the encapsulant layer is advantageous also from the perspective of the recycling efficiency of solar cell modules.

(Electrode)

There are no particular limitations on the structure and material of the electrodes in the solar cell module; in a specific example, the electrode has laminate structure consisting of a transparent conductive film and a metal film. The transparent conductive film is made of $SnO_2$, ITO, ZnO or the like. The metal film is made of metal such as silver, gold, copper, tin, aluminum, cadmium, zinc, mercury, chromium, molybdenum, tungsten, nickel or vanadium. These metals may be used singly or in the form of alloy. The transparent conductive film and metal film are formed by CVD, sputtering, evaporation or the like.

(Manufacturing Method of Solar Cell Module)

One example of a method of the present invention for manufacturing a solar cell module includes the steps of: (i) sequentially layering a transparent front protection member, a solar cell encapsulant, solar cells, a solar cell encapsulant, and a back protection member to form an assembly; and (ii) heating and pressing the assembly to bind the module components into one piece.

In step (i) the solar cell encapsulants are preferably placed so that raised and recessed reliefs (embossed surface) are against the solar cells.

In step (ii) the module assembly obtained in step (i) is heated and pressed using a common technique with a vacuum laminator or heat press to combine the module components into one piece (i.e., encapsulate the solar cells). Due to its good cushion characteristics, the solar cell encapsulant of the present invention can prevent possible damages to the solar cells upon encapsulation. Moreover, since the solar cell encapsulant has good degassing ability, air trapping does not occur enabling high-yield manufacturing of high-quality products.

When manufacturing a solar cell module, the ethylene/α-olefin resin composition constituting the solar cell encapsulant is crosslinked and cured. The crosslinking may be carried out either simultaneous with or after step (ii).

When the crosslinking step is carried out after step (ii), the laminate is heated for 3-6 minutes at 125-160° C. under a vacuum of 10 Torr or less, and pressed by atmosphere pressure for about 1Upon encapsulation, 15 minutes, whereby the module components are combined into one piece. The crosslinking step after step (ii) can be carried out using a common method; for example, tunnel-type continuous crosslinking furnace may be employed, or tray-type batch-wise crosslink furnace may be employed. The crosslinking is typically carried out 130-155° C. for about 20-60 minutes.

On the other hand, when the crosslinking step is carried out simultaneously with step (ii), the crosslinking condition can be the same as that for the case where crosslinking is carried out after step (ii) except that heating temperature is set to 145-170° C. and the time of pressing by atmosphere pressure in step (ii) is set to 6-30 minutes. The solar cell encapsulant of the present invention exhibits superior crosslinking characteristics as it contains a specific organic peroxide, and thus does not need to undergo a two-stage adhesion step in step (ii); the adhesion step can be completed in short time at high temperature and a crosslinking step after step (ii) can be omitted. It is thus possible to increase the productivity of solar cell modules.

In either case, manufacture of the solar cell module of the present invention may be carried out by temporarily bonding the solar cell encapsulants of the present invention to the solar cells and protection members at such a temperature that the crosslinking agent does not substantially decompose and the encapsulants melt, and raising the temperature to effect sufficient adhesion and crosslinking of the encapsulants. An additive formulation that can satisfy the conditions may be selected; for example, type and compounding amount of the above-described crosslinking agent and crosslinking aid may be selected.

The solar cell encapsulant of the present invention subjected to a lamination process under the crosslinking condition preferably has a gel fraction of 50-95%, preferably 50-90%, more preferably 60-90%, and most preferably 65-90%. Gel fraction is calculated for example by sampling 1 g of the encapsulant sheet from the solar cell module, subjecting the sample to Soxhlet extraction with boiled toluene for 10 hours, filtrating the extract through a 30 mesh stainless steel sieve, drying the sieve in vacuo at 110° C. for 8 hours, and measuring the amount of filter cake remained on the sieve. When gel fraction is less than 50%, heat resistance of the solar cell encapsulant is insufficient, and the solar cell encapsulant tends to exhibit reduced adhesion after a constant temperature/humidity test at 85° C. and 85% RH, a high-intensity xenon exposure test at a black panel temperature of 83° C., a heat cycle test from −40° C. to 90° C., and a heat resistance test. When gel fraction exceeds 95%, flexibility of the solar cell encapsulant decreases and temperature followability in a heat cycle test from −40° C. to 90° C. decreases. Therefore, delamination and/or other events may occur.

(Power Generation Equipment)

A solar cell module of the present invention is superior in productivity, power generation efficiency, longevity, and the like. Accordingly, power generation equipment that includes such a solar cell module is superior in cost, power generation efficiency, longevity and the like, and therefore is of high practical value. The power generation equipment is suitable for a long term regardless whether indoor or outdoor, e.g., on the roof of a building, or usage as a portable power source for outdoor activities such as camping or as an auxiliary power source for car batteries.

EXAMPLES

The present invention will now be described in detail based on Examples, which however shall not be construed as limiting the scope of the invention thereto.

[Ethylene Unit Content, α-Olefin Unit Content, and Non-conjugated Polyene Unit Content]

0.35 g of the sample was dissolved under heating into 2.0 ml of hexachlorobutadiene, the solution was filtrated through glass filter (G2), 0.5 ml of deuterated benzene was added, and the solution was loaded into an NMR tube (10 mm in inner diameter). Using JNM GX-400 NMR spectrometer (JEOL), $^{13}$C NMR spectroscopy was performed at 120° C. Scan count was more than 8000 times. The ethylene unit content, α-olefin unit content, and non-conjugated unit content in the ethylene/α-olefin/non-conjugated polyene copolymer were quantified based on the measured $^{13}$C-NMR spectrum.

[MFR]

The MFR of the ethylene/α-olefin/non-conjugated polyene copolymer was measured in accordance with ASTM D1238 at 190° C. under a load of 2.16 kg.

[Shore A Hardness]

The ethylene/α-olefin/non-conjugated polyene copolymer was heated at 190° C. for 4 minutes, pressurized at 10 MPa, and cooled to room temperature at 10 MPa to provide a 3 mm-thick sheet. Using the sheet, the Shore A hardness of the ethylene/α-olefin/non-conjugated polyene copolymer was measured in accordance with ASTM D2240.

[B Value]

The "B value" of the ethylene/α-olefin/non-conjugated polyene copolymer was calculated based on the $^{13}$C-NMR spectrum using the following equation:

$$B=(c+d)/(2\times a\times(e+f)) \quad (1)$$

where "a" denotes a ratio of ethylene unit (molar fraction of ethylene) in the ethylene/α-olefin/non-conjugated polyene copolymer; "c" denotes a ratio of ethylene/α-olefin chain unit (molar fraction of ethylene/α-olefin dyad sequence); "d" denotes a ratio of ethylene/non-conjugated polyene chain (molar fraction of ethylene/non-conjugated polyene dyad sequence); "e" denotes a ratio of α-olefin unit (molar fraction of α-olefin); and "f" denotes a ratio of non-conjugated polyene unit (molar fraction of non-conjugated polyene).

[Ethylene Distribution Parameter P]

0.02 g of the ethylene/α-olefin/non-conjugated polyene copolymer was dissolved into 10 ml of eluent cyclohexane and was filtrated through a 0.45 μm-pore size filter to prepare a measurement sample for GPC-offline-FTIR. Using cyclohexane as eluent, GPC-offline-FTIR measurement was carried out at an eluent flow rate of 1.0 mL/min and at 60° C. The device used was gel permeation chromatograph (Alliance GPC-2000, Waters); the columns used were TSKgell (GM-HHR-H)×2 (Tosoh Corporation); the detector used was differential refractometer RI-8020 (Tosoh Corporation), and the FTIR spectrometer used was LC-Transform Series 300 (Lab Connection Inc.).

Molecular weight was measured in terms of polyisobutylene. The detector and FTIR spectrometer were connected in tandem after the column exit such that the flow rate is substantially the same for the two devices. Ethylene distribution parameter P is defined as [A721 cm$^{-1}$/A4320 cm$^{-1}$], where A721 cm$^{-1}$ is a maximum peak intensity in the range of 721±20 cm$^{-1}$, and A4320 cm$^{-1}$ is a maximum peak intensity in the range of 4,320±20 cm$^{-1}$ in the measured FTIR spectrum. The maximum peak intensity within the range of 721±20 cm$^{-1}$ is an intensity based on the baseline connecting the minimum point within the range of 782±20 cm$^{-1}$ and the minimum point within the range of 690±20 cm$^{-1}$. Similarly, the maximum peak intensity within the range of 4,320±20 cm$^{-1}$ is an intensity based on the baseline connecting the minimum point within the range of 4480±20 cm$^{-1}$ and the minimum point within the range of 3,500±20 cm$^{-1}$.

[Activation Energy (Ea) of Fluidization(Ea)]

Based on temperature-time superposition principle, melt complex viscosity-frequency curves (melt complex viscosity unit: Pa/s; frequency unit: rad/sec) for the etylene/α-olefin/non-conjugated polyene copolymer at 170° C. and 210° C. (T (° C.)) were superimposed to the melt complex viscosity-frequency curve at 190° C. A linear approximation (I) of ln(aT) with respect to 1/(T+273.16) was obtained by the method of least square from temperatures (T) and from shift factors (aT) at the respective temperatures (T). Ea was determined from the gradient m of the linear approximation (I) and equation (II) shown below.

$$\ln(aT)=m[1/(T+273.16)]+n \quad (I)$$

$$Ea=0.008314\times m \quad (II)$$

aT: Shift factor
Ea: activation energy of fluidization (unit: kJ/mol)
T: temperature (° C.)
n: Y axis intercept The above-described calculation was conducted using commercially available calculation software (RSI Orchestrator VER. 6.6.3; TA Instruments Japan Inc.). The shift factor (aT) is the amount of shift that is required for the curve of the melt complex viscosity-frequency (log-log) at 170° C. or 210° C. to be shifted along log(Y)=−log(X) axis (where Y axis is melt complex viscosity and X axis indicates frequency) and were superimposed on the melt complex viscosity-frequency curve at 190° C. In the superimposition, the log-log curve of the melt complex viscosity-frequency at each temperature (T) was shifted in such a way that the frequency is multiplied by a factor of aT and the melt complex viscosity is multiplied by a factor of 1/aT. The correlation coefficient upon determination of linear approximation (I) was no less than 0.99, the correlation coefficient being obtained from shift factors (aT) at 170° C., 190° C. and 210° C. and temperatures by the method of least squares.

The melt complex viscosity-frequency curves were created using a viscoelasticity meter described below. The test specimen used was prepared by pressing the ethylene/α-olefin/non-conjugated polyene copolymer at 190° C. to prepare a 2 mm-thick sheet and stamping the sheet into a disk shape having a diameter of 25 mm. The test specimen may previously contain an appropriate amount (e.g., about 1,000 ppm) of antioxidant.

Viscoelasticity meter: RDS-2 (Rheometric Scientific)
Measurement condition was:
  Geometry: Parallel plate
  Measurement temperature: 170° C., 190° C., 210° C.
  Frequency: 0.5-79.577 Hz
  Distortion factor: 1.0%

The frequency dependence of viscosity was measured under the above-described condition, and the activation energy of fluidization was calculated using the above-described Arrhenius type equation. RSI Orchestrator VER. 6.6.3 (TA Instruments Japan Inc.) was used as data processing software.

[Molecular Weight Distribution (Mw/Mn)]

The weight-average molecular weight (Mw) and number-average molecular weight (Mn) of the ethylene/α-olefin/non-conjugated polyene copolymer were measured in the manner described below using a gel permeation chromatograph (Alliance GPC-2000, Waters). Molecular weight distribution Mw/Mn was calculated from the measured values.

Separation columns used were TSKgel GMH6-HT×2 plus SKgel GMH6-HTL×2. The column size was 7.5 mm in inner diameter and 300 mm in length, with the column temperature set to 140° C. Orthodichlorobenzene (Wako Pure Chemical Industries, Ltd.) was employed as an eluent with 0.025 wt % of BHT (butylhydroxytoluene, Takeda Pharmaceutical Co., LTd.) added as an antioxidant. The eluent was pumped at a flow rate of 1.0 ml/min. The sample concentration was 15 mg/10 ml, and the injection volume was set at 500 μl. As a detector a differential refractometer was employed. The polystyrene standards used were products from Tosoh Corporation for molecular weight ranges of Mw≤1,000 and Mw≥4×$10^6$, and products from Pressure Chemical Company for a molecular weight range of 1,000≤Mw≤4×$10^6$.

[Chlorine Ion Content]

Approximately 10 g of the ethylene/α-olefin/non-conjugated polyene copolymer was precisely weighed into a glass container sterilized in an autoclave or other device, 100 ml of ultrapure water was added, the glass container was sealed air-tight, and the sample was subjected to ultrasonic extraction (38 kHz) for 30 minutes at ambient temperature to prepare an extract liquid. The extract liquid was measured for chlorine ion content in the ethylene/α-olefin/non-conjugated polyene copolymer using chromatography ICS-2000 (Dionex).

[Amount of Copolymer Extracted into Methyl Acetate]

Approximately 10 g of the ethylene/α-olefin/non-conjugated polyene copolymer was precisely weighed into methyl acetate, and the sample was subjected Soxhlet extraction using methyl acetate at a temperature equal to or above the solvent's boiling point. The amount of the ethylene/α-olefin/non-conjugated polyene copolymer extracted into methyl acetate was measured based on either the difference in weight of the copolymer between before and after extraction, or the amount of residue from which the extraction solvent has been evaporated.

[Adhesion Strength to Glass]

A 500 μm-thick sheet sample was laid over a transparent glass plate (transparent protection member for solar cells), and the assembly was placed on a 150° C. hot platen of vacuum laminator LM-110×1605 (NPC Inc.) and vacuumed for 3 minutes and heated for 9 minutes to fabricate a laminate of transparent glass and sheet sample as an adhesion strength test sample. The sheet sample layer of the test sample was cut to a width of 15 mm, and the sheet sample layer was peeled off in 180° direction to measure the adhesion to the glass plate (adhesion strength to glass). The measurement was made on tensile tester Instron 1123 (Instron Co., Ltd.). The 180° peel strength was measured three times at 23° C. at a 30 mm span and a 30 mm/min crosshead speed, and the average value of the three measurements was used.

[Total Light Transmittance]

A laminate having the structure clear glass/sheet sample/clear glass was fabricated under the same condition as that used for the fabrication of the above-described adhesion test sample. Clear glass has no absorption region in the wavelength range of 350-800 nm. Using Hitachi spectrophotometer U-3010 coupled with a 150 mm-diameter integrating sphere attachment, the total light transmittance of the sheet sample in the laminate was measured in the wavelength range of 350-800 nm. The measured value was multiplied by illuminant D65 and spectral luminous efficiency V(X) to find total light transmittance in the visible range (Tvis).

[Degree of Electrode Corrosion]

A sheet sample was sandwiched between a pair of glass plates with deposited Ag layer at the center (thin-film electrodes). The assembly was processed under the same condition as that used for the fabrication of the above-described adhesion strength test sample to fabricate a laminate. The laminate was subjected to a 2,000 hour-acceleration test in accordance with JIS C8917 using custom-made XL75 (Suga Test Instruments Co., Ltd.) at a chamber internal temperature of 85° C. and a humidity of 85%. The degree of electrode corrosion was evaluated by visual observation of the status of the samples exposed to the acceleration test, where the sample with electrode corrosion was evaluated as "YES" and the sample without electrode was evaluated as "No."

[Cracking of Solar Cells]

A 150 μm-thick silicon plate was sliced from a silicon ingot. Under the same condition as that used for the fabrication of the above-described adhesion strength test sample, a laminate having the structure clear glass/sheet sample/silicon plate/sheet sample/PET backsheet was fabricated. The silicon plate in the laminate was visually observed for the presence and absence of cracks.

[Heat Resistance]

A sheet sample was placed on a 150° C. hot platen of a vacuum laminator and vacuumed for 3 minutes and heated for 9 minutes to provide a crosslinked sheet sample. The crosslinked sheet sample was cut in a piece measuring 1 cm width and 5 cm length. 3 cm apart mark lines were drawn on the cut sample, a weight that weighs three times the weight of the sample was suspended from the sample, and heat resistance test was performed wherein the sample was allowed to stand in a 100° C. oven for 1 hour. Elongation between marks lines was measured for the tested sample. Samples that fell during the heat resistance test were evaluated as "fall."

The heat resistance test provides a guide to determine crosslinking characteristics. Sufficient crosslinking results in small elongation during the heat resistance test; insufficient crosslinking results in large elongation during the heat resistance test; and further insufficient crosslinking results in "fall" of the sample.

[Sheet Blocking]

Two sheet samples were prepared and overlaid on top of each other with the embossed side of one of the sheet samples facing the non-embossed side of the other. A laminate having the structure glass/laminated sheet sample/glass was fabricated. A 400 g weight was placed on the laminate placed with the embossed side facing up. The laminate was allowed to stand in a 40° C. oven for 24 hours, taken out from the oven, allowed to cool to room temperature, and measured for peel strength. The measurement was made on tensile tester Instron 1123 (Instron Co., Ltd.). The 180° peel strength was measured at 23° C. at a 30 mm span and a 30 mm/min crosshead speed. The average value of three measurements was employed, and sheet blocking was evaluated based on the following criteria:

A: peel strength is less than 50 gf/cm.
B: Peel strength is 50-100 gf/cm.
C: Peel strength is more than 100 gf/cm.

[Calenderability]

"Melt splitting" and "release failure" upon calendering under the calender roll condition described later were evaluated. "Melt splitting" means that the melt fails to wrap around only one of two adjacent calender rolls but it splits and wrap around both the two calender rolls. "Release failure" means that the sheet is so viscous that it sticks to the roll and cannot be released from the roll.

A: No melt splitting and release failure occurred; calendering was possible
B: Melt splitting or release failure occurred, but calendering was possible with difficulty.
C: Significant melt splitting and release failure occurred; calendering was not possible.

[Sheet Appearance]

The appearance of a sheet calendered under the calender roll condition described later was evaluated.

A: No flow marks, no irregularity, uniform thickness
B: Slight flow marks, thickness non-uniformity or irregularity.
C: Significant flow marks, thickness non-uniformity and irregularity

[Volume Resistivity at 100° C.]

The obtained sheet was cut into 10 cm by 10 cm length and laminated in laminator LM-110×1605 (NPC Inc.) at 150° C. for a vacuuming time of 3 minutes and a pressing time of 15 minutes to fabricate a crosslinked sheet for measurement. The volume resistivity ($\Omega \cdot cm$) of the crosslinked sheet was measured at an applied voltage of 500V in accordance with JIS K6911. The measurement temperature was set to 100±2° C. using resistivity chamber 12708 (Advantest Corp.), and microammeter R8340A (Advantest Corp.) was used.

(2) Synthesis of Ethylene/α-Olefin/Non-Conjugated Polyene Copolymer

Synthesis Example 1

A 2,000-ml polymerization device fully purged with nitrogen gas was charged with 1,000 ml of dry hexane, 2 ml of 5-vinyl-2-norbornene (VNB), and 0.3 mmol of triisobutylaluminum. After raising the internal temperature of the polymerization device to 80° C., hydrogen (5 NmL) was introduced. Propylene was supplied into the polymerization device so that the system pressure was raised to 0.25 MPa. Subsequently, ethylene was supplied into the polymerization device so that the system pressure was 0.8 MPa. A hexane solution containing 0.001 mmol of (t-butylamide)dimethyl (tetramethyl-η5-cyclopentadienyl)silane titaniumdichloride and 0.005 mml of triphenylcarbenium(tetrakispentafluorophenyl)borate was added in the polymerization device. With maintaining the internal temperature of the polymerization device at 80° C. and system pressure at 0.8 MPa, polymerization was allowed to take place for 10 minutes. Polymerization reactions were quenched by the addition of 2 ml methanol. After the pressure was released, a polymer was precipitated from the polymerization solution in 2 L of methanol, and the precipitated polymer was dried in vacuo at 130° C. for 12 hours to afford 50 g of ethylene/propylene/5-vinyl-2-norbornene copolymer. Physical properties of the copolymer are set forth in Table 1.

Synthesis Examples 2, 3, 5, 6, 8, 9, and 12

Ethylene/α-olefin/non-conjugated polyene copolymers were prepared under the same condition as that in Synthesis Example 1 except that concentrations of (t-butylamide)dimethyl(tetramethyl-η5-cyclopentadienyl)silane titaniumdichloride and triphenylcarbenium(tetrakispentafluorophenyl)borate, the system pressure when propylene is supplied, the charging amount of hydrogen, and the use amounts of 5-vinyl-2-norbornene (VNB) and 5-ethylidene-2-norbornene (ENB) were changed. Physical properties of the ethylene/α-olefin/non-conjugated polyene copolymers are set forth in Table 1.

Synthesis Example 4

An ethylene/α-olefin/non-conjugated polyene copolymer was prepared under the same condition as that in Synthesis Example 1 except that (i) 5-vinyl-2-norbornene (VNB) was replaced by 25 ml of 5-ethylidene-2-norbornene (ENB), (ii) the propylene pressure was set to 0.33 MPa, (iii) hydrogen (5 Nml) was used, (iv) (t-butylamide)dimethyl(tetramethyl-η5-cyclopentadienyl)silane titaniumdichloride was replaced by diphenylmethylene(cyclopentadienyl)(fluorenyl) zirconium dichloride, (v) triphenylcarbenium(tetrakispentafluorophenyl)borate was replaced by 0.5 mmol of methyl aluminoxane in toluene, and (vi) 0.5 mmol of triisobutylaluminum was used. Physical properties of the ethylene/α-olefin/non-conjugated polyene copolymer are set forth in Table 1.

Synthesis Example 7

An ethylene/α-olefin/non-conjugated polyene copolymer was prepared under the same condition as that in Synthesis Example 4 except that (i) 5-ethylidene-2-norbornene (ENB) was replaced by 2.5 ml of 5-vinyl-2-norbornene (VNB), (ii) propylene pressure was set to 0.28 MPa, and (iii) hydrogen (1 Nml) was used. Physical properties of the ethylene/α-olefin/non-conjugated polyene copolymer are set forth in Table 1.

Synthesis Example 10

In a stainless steel polymerization vessel equipped with an impeller, hexane as solvent, ethylene, propylene, hydrogen and 5-vinyl-2-norbornene (VNB) were continuously supplied from above the polymerization vessel at a flow rate of 5 L/hr (hexane), 370 NL/hr (ethylene), 263 NL/hr (propylene), 2 NL/hr (hydrogen), and 2.2 g/hr (VNB). At the same time, a polymerization liquid was continuously drained from the bottom of the polymerization vessel so that the amount of the polymerization liquid in the polymerization vessel was kept at 5 L. Vanadium oxychloride was supplied so that the vanadium concentration in the polymerization vessel was 0.3 mmol/L. Ethylaluminium sesquichloride was supplied so that the aluminum concentration in the polymerization vessel was 3 mmol/L. Polymerization temperature was adjusted to 30° C.

The ethylene/α-olefin/non-conjugated polyene copolymer in normal hexane continuously drained from the bottom of the polymerization vessel was mixed with methanol as a quencher supplied at a flow rate of 0.2 mL/min, whereby the catalyst was deactivated to quench the polymerization reactions. 5 L of the ethylene/α-olefin/non-conjugated polyene copolymer in normal hexane was placed in a 15 L capacity glass container equipped with an impeller, followed by the addition of approximately 10 mL of 0.5N dilute hydrochloric acid and 5 L of pure water. After stirring, the aqueous phase was separated. Thereafter, 5 L of pure water was added, and similar stirring and aqueous phase separation were repeated 5 times removing the catalyst residue in the ethylene/α-olefin/non-conjugated polyene copolymer. The ethylene/α-olefin/non-conjugated polyene copolymer in normal hexane deprived of catalyst residue was dried at 130° C. in a vacuum drier to afford ethylene/α-olefin/non-conjugated polyene copolymer at a rate of 200 g/hr. Physical properties of the ethylene/α-olefin/non-conjugated polyene copolymer are set forth in Table 1.

Synthesis Example 11

An ethylene/α-olefin/non-conjugated polyene copolymer was prepared under the same condition as that in Synthesis Example 4 except that 0.4 ml of 5-vinyl-2-norbornene (VNB) was used and that propylene was replaced by 40 g of 1-butene. Physical properties of the ethylene/α-olefin/non-conjugated polyene copolymer are set forth in Table 1, where Pr represents propylene.

(3) Manufacture of Solar Cell Encapsulant (Sheet)

Example 1

An ethylene resin composition was prepared by blending 0.3 parts by weight of γ-methacryloxypropyl trimethoxy silane as an ethylenically-unsaturated silane compound, 0.4 parts by weight of t-butylperoxy-2-ethylhexyl carbonate having a 1 minute half-life temperature of 166° C. as an organic peroxide, 1.2 parts by weight of triallyl isocyanurate as the crosslinking aid, 0.4 parts by weight of 2-hydroxy-4-normaloctyloxybenzophenone as a UV absorber, 0.2 parts by weight of bis(2,2,6,6-tetramethyl-4-piperidyl)sebacate as a radical scavenger, 0.1 parts by weight of tris(2,4-di-tert-buthylphenyl)phosphite as the first thermal stabilizer, and 0.1 parts by weight of octadecyl-3-(3,5-di-tert-butyl-4-hydroxyphenyl)propionate as the second thermal stabilizer, per 100 parts by weight of the ethylene/α-olefin/non-conjugated polyene copolymer prepared in Synthesis Example 1.

100 g of the ethylene resin composition was charged into a mixing roll mill (Toyo Kogyo Co., LTd., two roll mixing mill, roll diameter: 5 inch, rotational speed: 18.15 rpm) and calendered into a 500 μm-thick sheet (solar cell encapsulant sheet). The surface temperature of the mixing rolls was set to 100° C. Evaluation results for the calendered sheet are set forth in Table 2.

Examples 2-6

Calendered sheets (solar cell encapsulant sheet) were prepared in the same manner as in Example 1 except that the formulations set forth in Table 2 were used. Evaluation results for the sheets are set forth in Table 2.

Comparative Examples 1-6

Calendered sheets (solar cell encapsulant sheets) were prepared in the same manner as in Example 1 except that the formulations set forth in Table 2 were used. Evaluation results for the sheets are set forth in Table 2.

TABLE 1

| Synthesis Example | 1 | 2 | 3 | 4 | 5 | 6 | 7 | 8 | 9 | 10 | 11 | 12 |
|---|---|---|---|---|---|---|---|---|---|---|---|---|
| Kind of α-olefin | Pr | Pr | Pr | Pr | Pr | Pr | Pr | Pr | Pr | Pr | 1-butene | Pr |
| Ethylene unit content [mol %] | 80 | 86.5 | 89 | 82 | 87 | 87 | 87 | 75 | 91 | 86 | 87 | 83 |
| α-olefin unit content [mol %] | 19.5 | 10.2 | 10.9 | 13.1 | 13 | 12.9 | 12.4 | 23.6 | 6 | 13.9 | 13.0 | 11.5 |
| ENB unit content [mol %] | | 2.5 | | 4.9 | | | | 1.2 | 3 | | | 4.5 |
| VNB unit content [mol %] | 0.5 | 0.5 | 0.1 | | | 0.1 | 0.6 | 0.2 | | 0.1 | 0.02 | 1.0 |
| MFR [g/10 min] | 5.0 | 2.1 | 9.5 | 5.1 | 5.2 | 10.2 | 1.0 | 5.1 | 5.1 | 2.3 | 5.1 | 2.3 |
| Shore A hardness [—] | 62 | 73 | 84 | 64 | 72 | 73 | 73 | 55 | 87 | 71 | 71 | 65 |
| B value [—] | 1.06 | 1.06 | 1.05 | 1.2 | 1.06 | 1.06 | 1.2 | 1.06 | 1.06 | 1.35 | 1.2 | 1.06 |
| Pmax/Pmin [—] | 1.4 | 1.4 | 1.4 | 1.2 | 1.4 | 1.4 | 1.2 | 1.4 | 1.4 | 2.6 | 1.2 | 1.4 |
| Activation energy (Ea) of fluidization [kJ/mol] | 36 | 42 | 29 | 35 | 27 | 29 | 30 | 26 | 34 | 34 | 28 | 47 |
| Mw/Mn [—] | 2.3 | 2.3 | 2.3 | 2.2 | 2.3 | 2.3 | 2.3 | 2.3 | 2.3 | 3.6 | 2.2 | 2.3 |
| Chlorine ion content [ppm] | 1.2 | 1.2 | 0.7 | 1.2 | 0.8 | 0.8 | 1.2 | 1.3 | 1.0 | 5.5 | 1.2 | 0.8 |
| Amount extracted in methyl acetate [wt %] | 1.0 | 0.5 | 1.5 | 0.8 | 1.1 | 1.6 | 0.6 | 2.1 | 0.8 | 2.2 | 0.8 | 0.3 |

TABLE 2

| Formulation (parts by weight) | | Ex. 1 | Ex. 2 | Ex. 3 | Ex. 4 | Ex. 5 | Ex. 6 |
|---|---|---|---|---|---|---|---|
| Copolymer | Synth. Ex. 1 | 100 | | | | | |
| | Synth. Ex. 2 | | 100 | | | | |
| | Synth. Ex. 3 | | | 100 | | | |
| | Synth. Ex. 4 | | | | 100 | | |
| | Synth. Ex. 5 | | | | | | |
| | Synth. Ex. 6 | | | | | | |
| | Synth. Ex. 7 | | | | | | |
| | Synth. Ex. 8 | | | | | | |
| | Synth. Ex. 9 | | | | | | |
| | Synth. Ex. 10 | | | | | 100 | |
| | Synth. Ex. 11 | | | | | | 100 |
| | Synth. Ex. 12 | | | | | | |
| Ethylenically-unsaturated silane compound | | 0.3 | 0.3 | 0.3 | 0.2 | 0.3 | 0.3 |
| Organic peroxide | | 0.4 | 0.2 | 0.4 | 0.2 | 0.4 | 0.4 |
| Crosslinking aid | | 1.2 | 1.2 | 1.2 | 1.2 | 1.2 | 1.2 |
| UV absorber | | 0.4 | 0.4 | 0.4 | 0.4 | 0.4 | 0.4 |
| Radical scavenger | | 0.2 | 0.2 | 0.2 | 0.2 | 0.2 | 0.2 |
| First thermal stabilizer | | 0.1 | 0.1 | 0.1 | 0.1 | 0.1 | 0.1 |
| Second thermal stabilizer | | 0.1 | 0.1 | 0.1 | 0.1 | 0.1 | 0.1 |
| Evaluation | | | | | | | |
| Total light transmittance [%] | | 93 | 91 | 90 | 92 | 91 | 91 |
| Adhesion strength to glass [N/cm] | | 32 | 42 | 27 | 49 | 35 | 25 |
| Cell cracking | | No | No | No | No | No | No |
| Heat resistance | | No | No | No | No | 0.5% elongation | 0.2% elongation |
| Corrosion of electrode | | No | No | No | No | YES | No |
| Sheet blocking | | B | A | A | B | A | A |
| Sheet appearance | | B | A | A | B | A | A |
| Calenderability | | B | A | A | B | A | A |
| Volume resistivity@100 C. [Ω · cm] | | $3.2 \times 10^{14}$ | $4.3 \times 10^{14}$ | $4.8 \times 10^{14}$ | $1.7 \times 10^{15}$ | $2.5 \times 10^{15}$ | $2.3 \times 10^{15}$ |
| Formulation (parts by weight) | | Comp. Ex. 1 | Comp. Ex. 2 | Comp. Ex. 3 | Comp. Ex. 4 | Comp. Ex. 5 | Comp. Ex. 6 |
| Copolymer | Synth. Ex. 1 | | | | | | |
| | Synth. Ex. 2 | | | | | | |
| | Synth. Ex. 3 | | | | | | |
| | Synth. Ex. 4 | | | | | | |
| | Synth. Ex. 5 | 100 | | | | | |
| | Synth. Ex. 6 | | 100 | | | | |
| | Synth. Ex. 7 | | | 100 | | | |
| | Synth. Ex. 8 | | | | 100 | | |
| | Synth. Ex. 9 | | | | | 100 | |
| | Synth. Ex. 10 | | | | | | |
| | Synth. Ex. 11 | | | | | | |
| | Synth. Ex. 12 | | | | | | 100 |
| Ethylenically-unsaturated silane compound | | 0.3 | 0.3 | 0.3 | 0.3 | 0.3 | 0.3 |
| Organic peroxide | | 0.2 | 0.4 | 0.4 | 0.2 | 0.2 | 0.2 |
| Crosslinking aid | | 1.2 | 1.2 | 1.2 | 1.2 | 1.2 | 1.2 |
| UV absorber | | 0.4 | 0.4 | 0.4 | 0.4 | 0.4 | 0.4 |
| Radical scavenger | | 0.2 | 0.2 | 0.2 | 0.2 | 0.2 | 0.2 |
| First thermal stabilizer | | 0.1 | 0.1 | 0.1 | 0.1 | 0.1 | 0.1 |
| Second thermal stabilizer | | 0.1 | 0.1 | 0.1 | 0.1 | 0.1 | 0.1 |
| Evaluation | | | | | | | |
| Total light transmittance [%] | | 91 | 91 | 91 | 93 | 88 | 90 |
| Adhesion strength to glass [N/cm] | | 16 | 16 | 14 | 19 | 45 | 57 |
| Cell cracking | | No | No | No | No | YES | No |
| Heat resistance | | 1.5% elongation | No | No | 0.5% elongation | No | No |
| Corrosion of electrode | | No | No | No | No | No | No |
| Sheet blocking | | A | A | A | C | A | A |
| Sheet appearance | | A | C | C | C | B | C |
| Calenderability | | A | C | C | C | B | B |
| Volume resistivity@100 C. [Ω · cm] | | $4.1 \times 10^{14}$ | $4.0 \times 10^{14}$ | $2.1 \times 10^{15}$ | $2.8 \times 10^{14}$ | $4.9 \times 10^{14}$ | $4.1 \times 10^{14}$ |

Example 7

(A) 100 parts by weight of ethylene/propylene/diene copolymer ("EPT3070" Mitsui Chemicals, Inc., diene: 5-ethylidene-2-norbornene with no melting point) and (B) 70 parts by weight of paraffinic oil ("PW100" Idemitsu Kosan Co., Ltd., density: 872 kg/cm³], kinematic viscosity: 100 mm²/s@40° C., hue+30 (Saybolt)) were kneaded with a 5-inch roll mill. The roll surface temperature was set to 50° C., and the rotational speed of the operating side roll was set to 18 rpm, and 15 rpm for the opposite roll. The MFR of the resultant oil-extended resin composition containing the ethylene/propylene/diene copolymer and the paraffinic oil is set forth in Table 3.

Subsequently, a resin composition was prepared by further adding 0.7 parts by weight of t-butylperoxy-2-ethylhexyl carbonate ("PERBUTYL E" NOF Corporation) as the cross linking agent, 1.0 part by weight of triallyl isocyanurate (TAIL, "DiakNo. 7" DuPont) as a crosslinking aid, and 0.2 parts by weight of 3-methacryloxypropyltrimethoxysilane ("Z-6030" Dow Corning Toray Silicone Co., Ltd.) as a silane coupling agent per 100 parts by weight of the ethylene/α-olefin/non-conjugated polyene copolymer followed by kneading of the blend in the 5-inch roll mill under the same condition as described above (roll surface temperature: 50° C., rotational speed of the operating side roll:18 rpm, and 15 rpm for the opposite roll). Evaluation results for the resin composition are set forth in Table 3.

Example 8

A resin composition was prepared in the same manner as in Example 7 except that ethylene/propylene/diene copolymer EPT3045 (melting point: 45° C., Mitsui Chemicals, Inc.) was used instead of ethylene/propylene/diene copolymer EPT3070 (Mitsui Chemicals, Inc.) and that 40 parts by weight of the paraffinic oil was used. Evaluation results for the resin composition are set forth in Table 3.

Example 9

A resin composition was prepared in the same manner as in Example 7 except that ethylene/propylene/diene copolymer prepared in Synthesis Example 7 was used instead of ethylene/propylene/diene copolymer EPT3070 (Mitsui Chemicals, Inc.) and that 20 parts by weight of the paraffinic oil was used. Evaluation results for the resin composition are set forth in Table 3.

Comparative Example 7

A resin composition was prepared in the same manner as in Example 7 except that 20 parts by weight of the paraffinic oil was used.

Comparative Example 8

A resin composition was prepared in the same manner as in Example 8 except that 70 parts by weight of the paraffinic oil was used.

Comparative Example 9

A resin composition was prepared in the same manner as in Example 7 except that a naphthenic oil ("SUNTHENE 4240" Japan Sun Oil Co., Ltd., density: 939 kg/cm$^3$, kinematic viscosity: 428 mm$^2$/s@40° C., hue L2.0) was used instead of the paraffinic oil ("PW100" Idemitsu Kosan Co., Ltd.).

The melt flow rate (MFR), roll processability and crosslinking characteristics of the resin compositions prepared in Examples 7-9 and Comparative Examples 7-9 and total light transmittance of cured materials thereof were evaluated through the procedures described below.

1) Melt Flow Rate (MFR)

The melt flow rate (MFR) of the oil-extended resin composition was measured in accordance with ASTM D1238 at 190° C. under a load of 2.16 kg.

2) Roll Processability

The state of the kneaded melt of the resin composition wrapped around a 5-inch roll (occurrence of bagging), sticking of the melt to the roll (occurrence of melt splitting) and appearance of the calendered sheet were evaluated. The roll surface temperature was set to 50° C., and the rotational speed of the operating side roll was set to 18 rpm, and 15 rpm for the opposite roll.

"Bagging" refers to a phenomenon in which the kneaded melt is too viscous to wrap around a roll (i.e., to form a rolling bank). "Melt splitting" refers to a phenomenon in which the viscosity of the kneaded melt is so low that the melt adheres to a pair of rolls resulting in failure to form a rolling bank between the rolls so that roll processing fails. "Rolling bank" refers to a mass of molten kneaded resin created between a pair of calender rolls.

The appearance of the calendered sheets was evaluated as follows:

Good: sheet has no undulation on the surface; sheet surface is smooth

Bad: sheet has undulation on the surface; sheet surface is not smooth

3) Crosslinking Characteristics

From a crosslinking curve for the resin composition measured in accordance with JIS-K6300-2 at a crosslinking temperature of 150° C. and a crosslinking time of 30 minutes, "maximum torque value S' max" and "minimum torque value S' min" were found. The during time to achieve a torque value equal to the sum of 10% of a difference plus minimum torque S' min was defined as "Tc10 (min)," the difference being between maximum torque value S' max and minimum torque value S' min. The during time to achieve a torque value equal to the sum of 90% of a difference plus minimum torque S' min was defined as "Tc90 (min)," the difference being between maximum torque value S' max and minimum torque value S' min.

4) Total Light Transmittance

The kneaded resin composition was sandwiched by Teflon® sheets, subjected to a heat press wherein it was heated at 100° C. for 3 minutes and pressed at 10 MPa for 2 minutes, and subjected to a cool press wherein it was pressed at 10 MPa at 20° C. for 3 minutes to form a 0.5 mm-thick sheet. The sheet was sandwiched by sheets of clear glass having no absorption region in the wavelength range of 350-800 nm to construct an assembly having the structure clear glass/sheet sample/clear glass. The assembly was laminated using a 150° C. vacuum laminator under the condition of 3 minute vacuuming and 8 minutes pressing. Total light transmittance of the specimen was measured with Hitachi spectrophotometer U-3010 coupled with a 150 mm-diameter integrating sphere attachment. The measured value was multiplied by illuminant D65 and spectral luminous efficiency V(X) to find total light transmittance in the visible range (Tvis).

TABLE 3

|  | Ex. 7 | Ex. 8 | Ex. 9 | Comp. Ex. 7 | Comp. Ex. 8 | Comp. Ex. 9 |
|---|---|---|---|---|---|---|
| Ethylene/α-olefin/diene copolymer | EPT3070 | EPT3045 | Synth. Ex. 7 | EPT3070 | EPT3045 | EPT3070 |
| PW100 | 70 | 40 | 20 | 20 | 70 |  |
| SUNTHENE 4240 |  |  |  |  |  | 70 |
| Paraffin content [wt %] in the oil | 71 | 71 | 71 | 71 | 71 | 43 |

TABLE 3-continued

|  | Ex. 7 | Ex. 8 | Ex. 9 | Comp. Ex. 7 | Comp. Ex. 8 | Comp. Ex. 9 |
|---|---|---|---|---|---|---|
| Naphthene content [wt %] in the oil | 29 | 29 | 29 | 29 | 29 | 44 |
| Aromatic content [wt %] in the oil | 0 | 0 | 0 | 0 | 0 | 13 |
| Sulfur content [wt ppm] in the oil | 10 | 10 | 10 | 10 | 10 | 400 |
| ML(1 + 4)100° C. | 70 | 40 | 40 | 70 | 40 | 70 |
| Ethylene content [mol %] | 67 | 65 | 87 | 67 | 65 | 67 |
| Diene content [mol %] | 1.3 | 1.3 | 0.6 | 1.3 | 1.3 | 1.3 |
| MFR before oil extension [g/10 min] | 0.4 | 1.0 | 1.0 | 0.1 | 0.58 | 0.1 |
| MFR after oil extension [g/10 min] | 4.4 | 3.5 | 2.3 | 0.3 | 12.8 | 2.7 |
| Roll processability | Good | Good | Good | Bad | Bad | Good |
| Melt splitting | No | No | No | No | YES | No |
| Bagging | No | No | No | YES | No | No |
| Sheet appearance | Good | Good | Good | Bad (undulation) | Bad (instable) | Good |
| Total light transmittance [%] | 90 | 91 | 91 | 91 | 89 | 72 |
| Crosslinking characteristics |  |  |  |  |  |  |
| S'max [dN · m] | 0.84 | 0.86 | 1.05 | 3.12 | 0.32 | N.D. |
| S'min [dN · m] | 0.20 | 0.18 | 0.19 | 0.73 | 0.08 | N.D. |
| Tc10 [min] | 1.61 | 1.44 | 1.41 | 1.51 | 1.27 | N.D. |
| Tc90 [min] | 10.55 | 11.14 | 11.95 | 11.32 | 9.03 | N.D. |
| Volume resistivity@23° C. [Ω · cm] | $3.5 \times 10^{16}$ | $1.5 \times 10^{17}$ | $3.9 \times 10^{17}$ | $3.9 \times 10^{17}$ | $3.3 \times 10^{16}$ | $2.0 \times 10^{15}$ |

As seen from Table 3, the resin compositions prepared in Examples 7-9 demonstrated good roll processability upon sheet molding without compromising crosslinking characteristics and high transparency of their cured material. By contrast, the resin compositions prepared in Comparative Examples 7-9 failed to simultaneously achieve good roll processability, crosslinking characteristics and transparency of their cured material.

More specifically, the resin composition prepared in Comparative Example 7 demonstrated good crosslinking characteristics due to low paraffinic oil content, but caused bagging due to excessively high viscosity resulting in non-uniform sheet thickness. Due to high paraffinic oil content, the viscosity of the resin composition prepared in Comparative Example 8 was so low that melt splitting occurred. Moreover, the resin composition prepared in Comparative Example 8 demonstrated low crosslinking characteristics as the crosslinking agent was diluted. On the other hand, the resin composition prepared in Comparative Example 9 demonstrated superior roll processability as it contains a naphthenic oil containing high amounts of naphthenic component and aromatic component, and thus caused no bagging or melt splitting. However, due to the presence of a naphthenic oil containing high amounts of naphthenic component and aromatic component, the resin composition prepared in Comparative Example 9 demonstrated low crosslinking characteristics, and the cured material thereof demonstrated low optical transmittance.

Example 10

Using the encapsulant in Example 6, a mini-module including a string of 18 monocrystalline cells connected in series was fabricated for evaluation. Clear float glass (AGC Fabritec Co., Ltd., 3.2 mm-thick embossed thermally treated glass) cut into 24 cm by 21 cm length was used as a module glass substrate. The crystalline cells (monocrystalline cells from Shinsung Solar Energy Corporation) were 5 cm by 3 cm in size with a busbar Ag electrode at the center of the light-incident side. The 18 crystalline cells were connected in series using copper ribbon cables. The copper ribbon cable refers a copper foil coated with eutectic solder on its surface. As a module backsheet, a polyethylene terephthalate (PET) substrate with deposited silica film was used. A slit of about 2 cm length was cut on the backsheet. The plus and minus terminals of the 18 crystalline cells connected in series can thus be pulled out through the slit.

A module assembly was fabricated that has the structure glass substrate/encapsulant in Example 6/crystalline cells/encapsulant in Example 6/backsheet. The module assembly was laminated using vacuum laminator LM-110X160-S (NPC Inc.) at a platen temperature of 150° C. for a vacuuming time of 3 minutes and a pressing time of 15 minutes. Subsequently, the encapsulant and backsheet squeezed out from the laminate were cut away. An edge sealant was applied to the glass edge of the laminate, and the laminate was framed with an aluminum frame. RTV silicone was applied to the slit in the backsheet and cured. In this manner a mini-module was fabricated that includes 18 monocrystalline cells connected in series.

The plus terminal and minus terminal of the mini-module were short-circuited, and a high-voltage side cable of a power source was connected. The low-voltage side cable of the power source was connected to the aluminum frame, and the aluminum frame was grounded. The mini-module was placed in a constant temperature and humidity chamber conditioned to 85° C. and 85% RH. After the mini-module temperature rose, a voltage of −600V was kept applied. As the high-voltage power source, HARb-3R10-LF (Matsusada Precision Inc.) was used, and FS-214C2 (ETAC) was used as the constant temperature and humidity chamber.

After applying voltage for 24 hours and 240 hours, the module was evaluated for IV characteristics using a xenon lamp with Air Mass (AM) 1.5 class A spectrum. PVS-116i-S (Nisshinbo Mechatronics Inc.) was used for the evaluation of IV characteristics. When the maximum output power Pmax in the IV characteristics after testing showed at least a 5% reduction from the initial value, it was determined that the module was defective. As a result of the measurement, both after a 24-hour and a 240-hour voltage application, % reduction of Pmax was below 0.5%.

Example 11

A test was carried out in the same manner as in Example 10 except that the encapsulant in Example 5 was used. Both after a 24-hour and 240-hour voltage application, reduction of Pmax was below 0.5%.

Example 12

A test was carried out in the same manner as in Example 10 except that the encapsulant in Example 1 was used. Reduction of Pmax after a 24-hour voltage application was below 0.5%.

Comparative Example 10

(Synthesis of Modified Polyvinyl Acetal Resin)

100 g of polyvinyl alcohol with an ethylene content of 15%, saponification degree of 98 mol % and mean degree of polymerization of 1,700 ("PVA-117" Kuraray Co., Ltd.) was dissolved in distilled water to afford 10 wt % PVA aqueous solution. With stirring the aqueous solution at 40° C. with an anchor impeller, 32 g of 35 wt % hydrochloric acid was added followed by dropwise addition of 60 g of butylaldehyde. Precipitation of polyvinyl acetal resin in the aqueous solution was confirmed. The temperature of the reaction mass was raised to 50° C. while adding 64 g of 35 wt % hydrochloric acid, and stirred for 4 hours to complete the reaction affording a dispersion of modified polyvinyl acetal resin.

The dispersion was cooled and neutralized to a pH of 7.5 with 30 wt % aqueous sodium hydroxide solution. The polymer was filtered off, washed with 20 volumes of distilled water, and dried. In this manner modified polyvinyl acetal resin was produced having a mean degree of polymerization of 1,700 and a degree of acetalization of 65 mol %.

(Manufacture of Sheet)

100 parts by weight of the modified polyvinyl acetal resin and 30 parts by weight of triethylene glycol-di-2-ethylhexanate were kneaded in a mill (Laboplastomill, Toyo Seiki Co., Ltd.) at 100° C. for 5 minutes at 30 rpm to afford a modified polyvinyl acetal resin composition. The composition was placed inside a 0.5 mm-thick stainless steel frame with a 25 cm×25 cm opening. The resin composition was laminated using a vacuum laminator at a platen temperature of 100° C. for a vacuuming time of 3 minutes and pressing time of 10 minutes to fabricate a flat sheet sample.

The volume resistivity of the sheet sample was lower than the measurement limit at 100° C., which was lower than $10^8$ Ω·cm. Using this sheet sample, a mini-module was fabricated in the same manner as in Example 10. The platen temperature of the laminator was set to 125° C. A high-voltage application test for the mini-module was carried out in the same manner as in Example 10. % Reduction of Pmax after a 24-hour voltage application was below 6% resulting in characteristics deterioration.

INDUSTRIAL APPLICABILITY

The solar cell encapsulant of the present invention is superior in characteristics such as transparency, flexibility, adhesion, and calenderability. The solar cell encapsulant of the present invention can thus provide a solar cell module that has superior economic efficiency (e.g., reduced costs) and performance as well as good appearance.

REFERENCE SIGNS LIST

20 Solar cell module
21 Solar cell
22A Light incident surface (of solar cell)
22B Back surface (of solar cell)
24 Front protection member
26 Back protection member
28 Encapsulation layer
29 Interconnector
32 Collector line
34A, 34B Tab-type busbar
36 Conductive layer

The invention claimed is:

1. A solar cell encapsulant comprising an ethylene/α-olefin/non-conjugated polyene copolymer which satisfies the following requirements a1) to a3):
   a1) a structural unit derived from ethylene is present in an amount of 80-90mol %, a structural unit derived from a $C_{3-20}$ α-olefin is present in an amount of 9.99-19.99mol %, and a structural unit derived from a non-conjugated polyene is present in an amount of 0.01-5.0 mol %;
   a2) a melt flow rate measured in accordance with ASTM D1238 at 190° C. under a load of 2.16 kg is 2 g/10 min to 10 g/10 min; and
   a3) a Shore A hardness measured in accordance with ASTM D2240 is 60-85.

2. The solar cell encapsulant according to claim 1, wherein the solar cell encapsulant satisfies the following requirement a4):
   a4) a volume resistivity measured at 100° C. and applied voltage of 500V in accordance with JIS K6911 is $1.0 \times 10^{13}$-$1.0 \times 10^{18}$ Ω·cm.

3. The solar cell encapsulant according to claim 1, further comprising 0.1-5.0 parts by weight of a silane coupling agent and 0.1-2.5 parts by weight of a crosslinking agent per 100 parts by weight of the ethylene/α-olefin/non-conjugated polyene copolymer.

4. The solar cell encapsulant according to claim 3, wherein the crosslinking agent is an organic peroxide having a 1 minute half-life temperature of 100-170° C.

5. The solar cell encapsulant according to claim 3, further comprising 0.05-5 parts by weight of at least one agent selected from the group consisting of a UV absorber, a thermal stabilizer, and a hindered amine light stabilizer, per 100 parts by weight of the ethylene/α-olefin/non-conjugated polyene copolymer.

6. The solar cell encapsulant according to claim 3, further comprising 0.05-5 parts by weight of a crosslinking aid per 100 parts by weight of the ethylene/α-olefin/non-conjugated polyene copolymer.

7. The solar cell encapsulant according to claim 1, wherein the ethylene/α-olefin/non-conjugated polyene copolymer further satisfies the following requirement a5):
   a5) a B value calculated from a $^{13}$C-NMR spectrum and the following formula (1) is 0.9-1.3:

$$B=(c+d)/(2 \times a \times (e+f)) \quad (1)$$

where a denotes a ratio of the structural unit derived from ethylene (molar fraction of ethylene) in the ethylene/α-olefin/non-conjugated polyene copolymer;
   c denotes a ratio of a structural unit of ethylene/α-olefin chain (molar fraction of ethylene/α-olefin dyad sequence);
   d denotes a ratio of a structural unit of ethylene/non-conjugated polyene chain (molar fraction of ethylene/non-conjugated polyene dyad sequence);
   e denotes a ratio of the structural unit derived from the α-olefin (molar fraction of α-olefin); and
   f denotes a ratio of the structural unit derived from the non-conjugated polyene (molar fraction of non-conjugated polyene).

8. The solar cell encapsulant according to claim 1, wherein the ethylene/α-olefin/non-conjugated polyene copolymer further satisfies the following requirement a6):

a6) a maximum value Pmax and a minimum value Pmin of an ethylene distribution parameter P measured by GPC-offline-FTIR satisfy the following formula (2):

$$P\text{max}/P\text{min} \leq 1.4 \qquad (2)$$

9. The solar cell encapsulant according to claim 1, wherein the ethylene/α-olefin/non-conjugated polyene copolymer further satisfies the following requirement a7):

a7) an activation energy (Ea) of fluidization is 28-45 kJ/mol.

10. The solar cell encapsulant according to claim 1, wherein the ethylene/α-olefin/non-conjugated polyene copolymer further satisfies the following requirement a8):

a8) a molecular weight distribution Mw/Mn based on gel permeation chromatography (GPC) is 1.2-3.5.

11. The solar cell encapsulant according to claim 1, wherein the ethylene/α-olefin/non-conjugated polyene copolymer further satisfies the following requirement a9):

a9) a chlorine ion content in an eluate from solid-phase-extraction as detected by ion chromatography is 2 ppm or less.

12. The solar cell encapsulant according to claim 1, wherein the ethylene/α-olefin/non-conjugated polyene copolymer further satisfies the following requirement a10):

a10) an amount of the ethylene/α-olefin/non-conjugated polyene copolymer extracted into methyl acetate is 5.0 wt % or less.

13. The solar cell encapsulant according to claim 1, wherein the solar cell encapsulant is in sheet form.

14. A solar cell module comprising:

a transparent front protection member;

a back protection member;

a solar cell sandwiched between the front protection member and the back protection member; and an encapsulant that encapsulates the solar cell between the transparent front protection member and back protection member, wherein the encapsulant is a cured material of the solar cell encapsulant according to claim 1.

15. The solar cell encapsulant according to claim 1, wherein the solar cell encapsulant is prepared by calendaring a melt-kneaded material into sheet, the melt-kneaded material comprising the ethylene/α-olefin/non-conjugated polyene copolymer and an additive.

* * * * *